United States Patent
Tanaka et al.

(10) Patent No.: US 11,848,358 B2
(45) Date of Patent: Dec. 19, 2023

(54) SILICON CARBIDE SEMICONDUCTOR DEVICE AND METHOD OF MANUFACTURING SAME

(71) Applicant: Mitsubishi Electric Corporation, Tokyo (JP)

(72) Inventors: Rina Tanaka, Tokyo (JP); Katsutoshi Sugawara, Tokyo (JP); Yutaka Fukui, Tokyo (JP); Hideyuki Hatta, Tokyo (JP); Yusuke Miyata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 350 days.

(21) Appl. No.: 17/276,488

(22) PCT Filed: Dec. 10, 2018

(86) PCT No.: PCT/JP2018/045278
§ 371 (c)(1),
(2) Date: Mar. 16, 2021

(87) PCT Pub. No.: WO2020/121371
PCT Pub. Date: Jun. 18, 2020

(65) Prior Publication Data
US 2022/0037474 A1   Feb. 3, 2022

(51) Int. Cl.
*H01L 29/16* (2006.01)
*H01L 29/06* (2006.01)
(Continued)

(52) U.S. Cl.
CPC ...... *H01L 29/1608* (2013.01); *H01L 29/0692* (2013.01); *H01L 29/1095* (2013.01);
(Continued)

(58) Field of Classification Search
CPC ............. H01L 29/0619; H01L 29/0623; H01L 29/0696; H01L 29/1095; H01L 29/1608;
(Continued)

(56) References Cited

U.S. PATENT DOCUMENTS

2003/0022474 A1   1/2003   Grover et al.
2004/0195618 A1   10/2004  Saito et al.
(Continued)

FOREIGN PATENT DOCUMENTS

JP   2003-229570 A   8/2003
JP   2004-522319 A   7/2004
(Continued)

OTHER PUBLICATIONS

Office Action dated Aug. 12, 2023 in Chinese Patent Application No. 201880099607.6 with English translation thereof, 15 pages.

*Primary Examiner* — Fazli Erdem
(74) *Attorney, Agent, or Firm* — XSENSUS LLP

(57) ABSTRACT

A drift layer is made of silicon carbide and has a first conductivity type. At least one trench has a first side surface facing a Schottky barrier diode region, and a second side surface extending in a transistor region and contacting a source region, a body region, and the drift layer. A first protective region is provided under the at least one trench, has a second conductivity type, and is higher in impurity concentration of the second conductivity type than the body region. A second protective region extends from the first protective region, reaches at least one of the first side surface and an end region of the second side surface continuous with the first side surface, has an uppermost portion shallower than a lowermost portion of the body region, and is higher in impurity concentration of the second conductivity type than the body region.

13 Claims, 22 Drawing Sheets

(51) Int. Cl.
*H01L 29/10* (2006.01)
*H01L 29/423* (2006.01)
*H01L 29/872* (2006.01)
*H01L 21/04* (2006.01)
*H01L 29/47* (2006.01)

(52) U.S. Cl.
CPC .......... *H01L 29/4236* (2013.01); *H01L 29/47* (2013.01); *H01L 29/872* (2013.01); *H01L 21/047* (2013.01)

(58) Field of Classification Search
CPC ........... H01L 29/4236; H01L 29/66068; H01L 29/7806; H01L 29/7813; H01L 29/872
USPC ....................................................... 257/471
See application file for complete search history.

(56) References Cited

U.S. PATENT DOCUMENTS

| | | |
|---|---|---|
| 2005/0287744 A1 | 12/2005 | One et al. |
| 2014/0175508 A1* | 6/2014 | Suzuki .............. H01L 29/41766 257/140 |
| 2016/0163852 A1* | 6/2016 | Siemieniec ........... H01L 29/045 438/237 |
| 2019/0181229 A1* | 6/2019 | Okumura .......... H01L 29/66348 |

FOREIGN PATENT DOCUMENTS

| | | | |
|---|---|---|---|
| JP | 2004-311716 A | 11/2004 | |
| JP | 2006-012967 A | 1/2006 | |

\* cited by examiner

F I G. 1 2
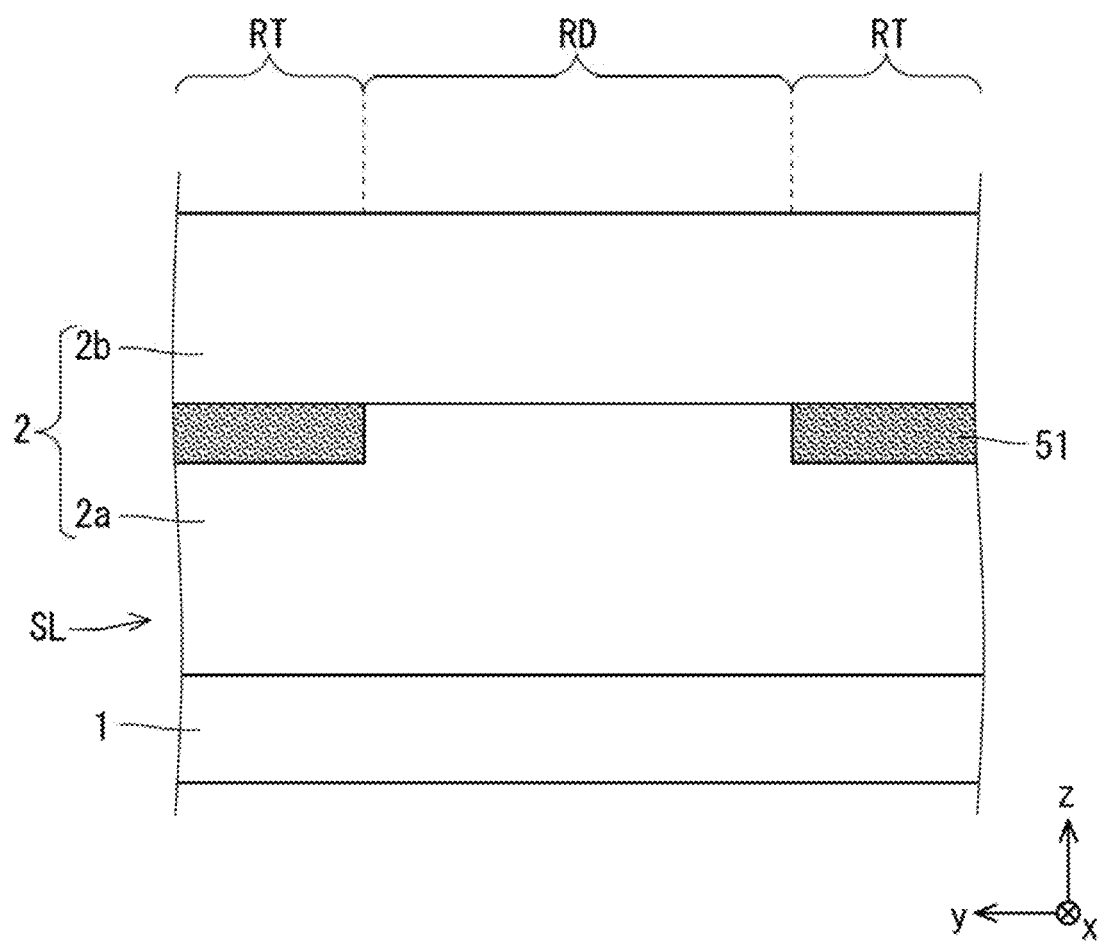

F I G. 1 8
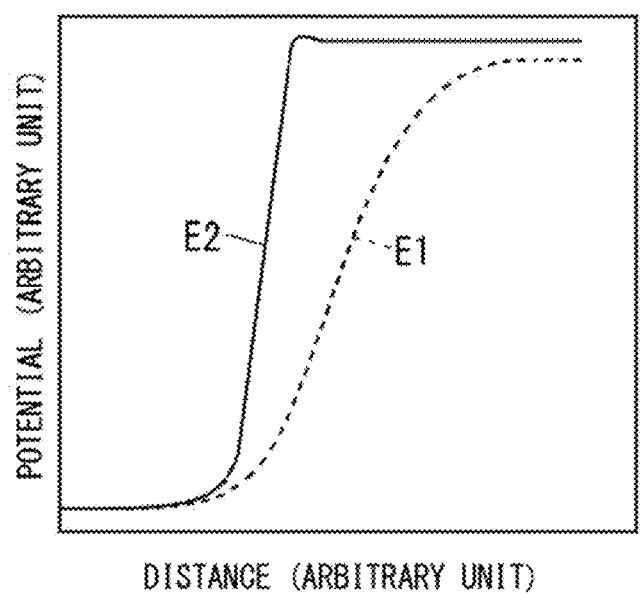

F I G. 1 9
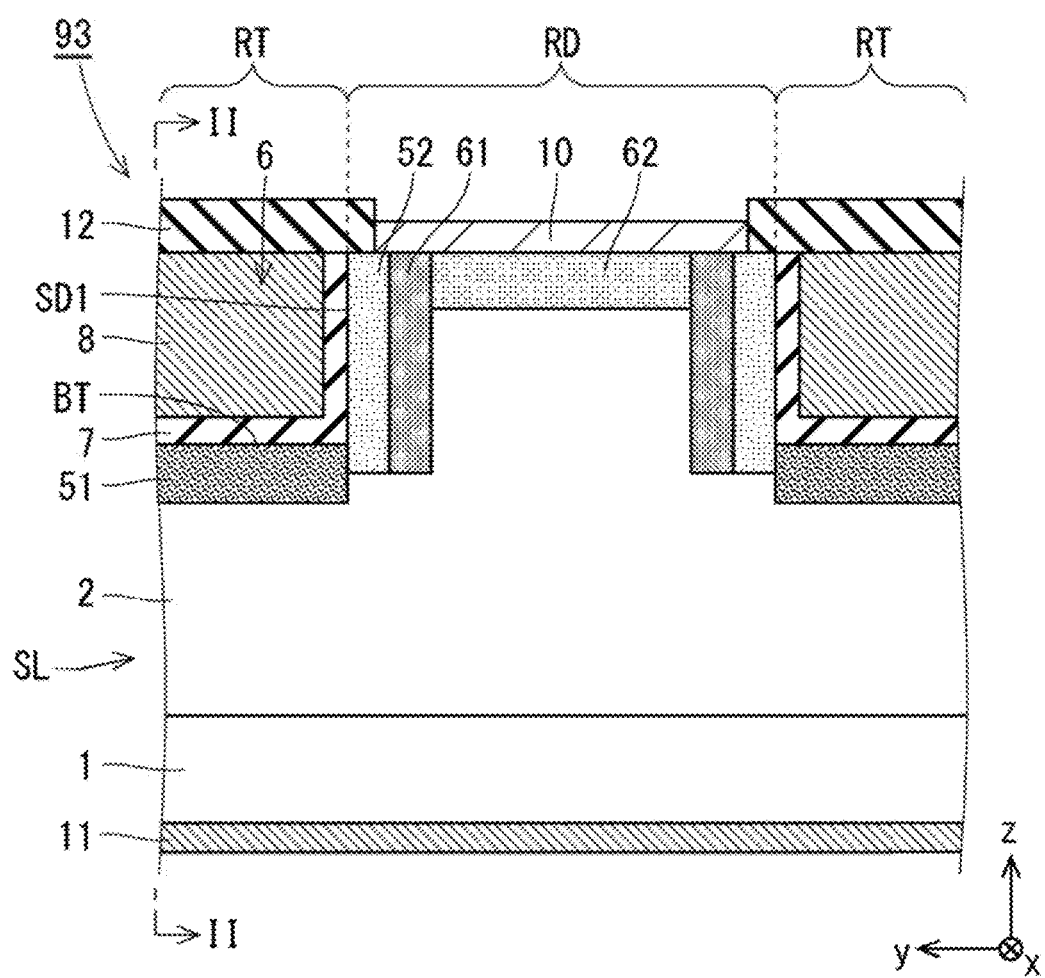

F I G. 2 1
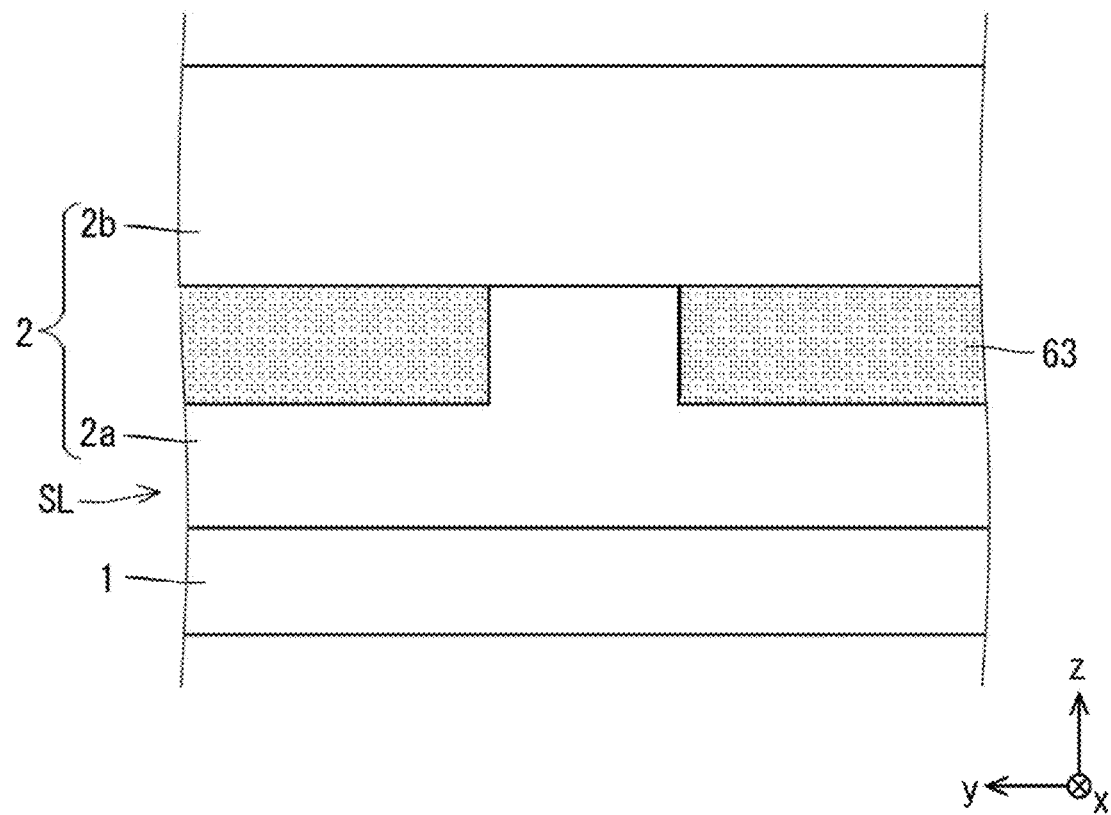

SILICON CARBIDE SEMICONDUCTOR DEVICE AND METHOD OF MANUFACTURING SAME

CROSS-REFERENCE TO RELATED APPLICATION

The present application is based on PCT filing PCT/JP2018/045278, filed Dec. 10, 2018, the entire contents of which are incorporated herein by reference.

TECHNICAL FIELD

The present invention relates to a silicon carbide semiconductor device and a method of manufacturing the same, particularly, to a silicon carbide semiconductor device with a trench gate and a method of manufacturing the same.

BACKGROUND ART

A known power semiconductor device has a configuration in which a Schottky barrier diode (SBD) as a unipolar free-wheeling diode is provided in a unipolar semiconductor switching element such as a metal oxide semiconductor field effect transistor (MOSFET). More specifically, a Schottky electrode is provided at a surface of a predetermined region in a chip to operate the predetermined region as the SBD. This achieves cost reduction, compared to a case of attaching a part functioning as a diode externally to an MOSFET chip. In particular, if silicon carbide (SiC) is used as a base material of the MOSFET, providing the unipolar Schottky barrier diode in the MOSFET achieves an advantage of suppressing bipolar operation by a parasitic pn diode belonging to the MOSFET. The reason for this is that, in the silicon carbide semiconductor device, carrier recombination energy resulting from the bipolar operation causes expansion of crystal defect, thereby causing a risk of damaging the reliability of an element.

Unlike a planar MOSFET, namely, unlike an MOSFET with a gate electrode formed on a planar surface, an MOSFET with a gate electrode formed in a trench, namely, a trench gate MOSFET has a channel formed on a side surface of the trench. This increases channel width density to allow reduction in ON resistance (resistance in an ON state). On the other hand, there arises a risk of electric field concentration at the bottom of the trench in an OFF state. This risk becomes serious, particularly if a drift layer of the MOSFET is made of SiC. The reason for this is that the high strength against insulation breakdown of SiC makes it likely that breakdown of a gate insulating film will be caused by electric field concentration at the bottom of the trench before avalanche breakdown occurs in the drift layer.

Electric field concentration at the bottom of the trench has been relaxed by a widely used method of providing a protective region having a different conductivity type from the drift layer under the trench. A trench-type semiconductor device has a plurality of trenches generally spaced at a predetermined distance in an arrangement direction orthogonal to a direction in which each of the trenches extends. Each protective region not only functions to relax electric field in a trench directly above this protective region but can also function to relax electric field in a trench adjacent to the trench directly above. Hence, the effect of relaxing electric field using the protective region can become lower with increase in the foregoing distance (namely, a trench-to-trench distance). For this reason, the trench-to-trench distance is desired not to be increased excessively in terms of the effect of relaxing electric field using the protective region.

If a Schottky barrier diode region is inserted between trenches adjacent to each other in the foregoing arrangement direction, limitation is imposed on the size of the Schottky barrier diode region in the arrangement direction in order to prevent excessive increase of the trench-to-trench distance. This causes difficulty in ensuring an enough area for the Schottky barrier diode region, making it difficult to obtain a high Schottky current. In this regard, instead of such arrangement, the Schottky barrier diode region may be arranged adjacent to an end portion of a trench in a direction in which the trench extends. This arrangement avoids the problem of excessive increase in the trench-to-trench distance in the arrangement direction. Such arrangement is disclosed in Japanese Patent Application Laid-Open No. 2003-229570 (patent document 1), for example.

PRIOR ART DOCUMENTS

Patent Documents

Patent Document 1: Japanese Patent Application Laid-Open No. 2003-229570

SUMMARY

Problem to be Solved by the Invention

If arrangement such as that described above is used, however, electric field concentration at an end portion of a trench in an extending direction thereof is likely to become a problem to be solved. Electric field concentration is likely to occur at the end portion of the trench, particularly at a boundary between a side surface of the trench and the bottom of the trench, namely, at a corner of the trench. Such electric field concentration causes a risk of breakdown of a gate insulating film at the end portion of the trench.

To make a current distribution and an electric field distribution as uniform as possible within a chip, the Schottky barrier diode region should not be provided unevenly only at the outer periphery of the chip but is also required to be interposed in a transistor region. In the presence of such requirement, due consideration has not been given so far to develop a method of preventing breakdown of the gate insulating film while ensuring a sufficient area for the Schottky barrier diode region.

The present invention has been made to solve the forgoing problem, and is intended to provide a silicon carbide semiconductor device including a sufficient Schottky barrier diode region and capable of enhancing the reliability of a gate insulating film.

Means to Solve the Problem

A silicon carbide semiconductor device of the present invention has a transistor region in which a Schottky barrier diode region is interposed in at least one direction included in an in-plane direction. The silicon carbide semiconductor device includes a semiconductor layer, a gate electrode, a gate insulating film, and a Schottky electrode. The semiconductor layer includes a drift layer, a body region, a source region, at least one trench, a first protective region, and a second protective region. The drift layer extends over the transistor region and the Schottky barrier diode region, reaches a surface of the semiconductor layer in the Schottky barrier diode region, is made of silicon carbide, and has a first conductivity type. The body region is provided on the drift layer in the transistor region and has a second conductivity type different from the first conductivity type. The source region is provided on the body region and has the first conductivity type. The at least one trench has a first side surface facing the Schottky barrier diode region, and a second side surface extending in the transistor region and contacting the source region, the body region, and the drift layer. The first protective region is provided under the at least one trench, has the second conductivity type, and is higher in impurity concentration of the second conductivity type than the body region. The second protective region extends from the first protective region, reaches at least one of the first side surface and an end region of the second side surface continuous with the first side surface, has an uppermost portion shallower than a lowermost portion of the body region, has the second conductivity type, and is higher in impurity concentration of the second conductivity type than the body region. The gate electrode is provided in the at least one trench. The gate insulating film separates the semiconductor layer and the gate electrode from each other in the at least one trench. The Schottky electrode contacts the semiconductor layer in the Schottky barrier diode region.

Effects of the Invention

According to the present invention, an electric field relaxation region formed by the first protective region and the second protective region protects a lower end and its vicinity of the trench at a trench end portion adjacent to the Schottky electrode. This reduces the occurrence of insulation breakdown of the gate insulating film at the lower end and its vicinity of the trench to be caused by electric field concentration. As a result, it becomes possible to increase the reliability of the gate insulating film.

These and other objects, features, aspects, and advantages of the invention will become more apparent from the following detailed description when taken in conjunction with the accompanying drawings.

BRIEF DESCRIPTION OF DRAWINGS

FIG. 12 is a partial cross-sectional view schematically showing a step of a modification of the method of manufacturing the silicon carbide semiconductor device according to the first embodiment of the present invention in a viewing field corresponding to the line III-III (FIG. 1);

FIG. 18 is a graph showing simulation result about a potential distribution at a pn junction and its vicinity formed by a first protective region according to each of the first embodiment and the second embodiment of the present invention;

FIG. 19 is a partial cross-sectional view schematically showing the configuration of a silicon carbide semiconductor device according to a third embodiment of the present invention in a viewing field corresponding to the viewing field of FIG. 17;

FIG. 21 is a partial cross-sectional view schematically showing a step of a modification of a method of manufacturing the silicon carbide semiconductor device according to the fourth embodiment of the present invention in a viewing field corresponding to the line III-III (FIG. 1);

DESCRIPTION OF EMBODIMENT(S)

Figure 1:
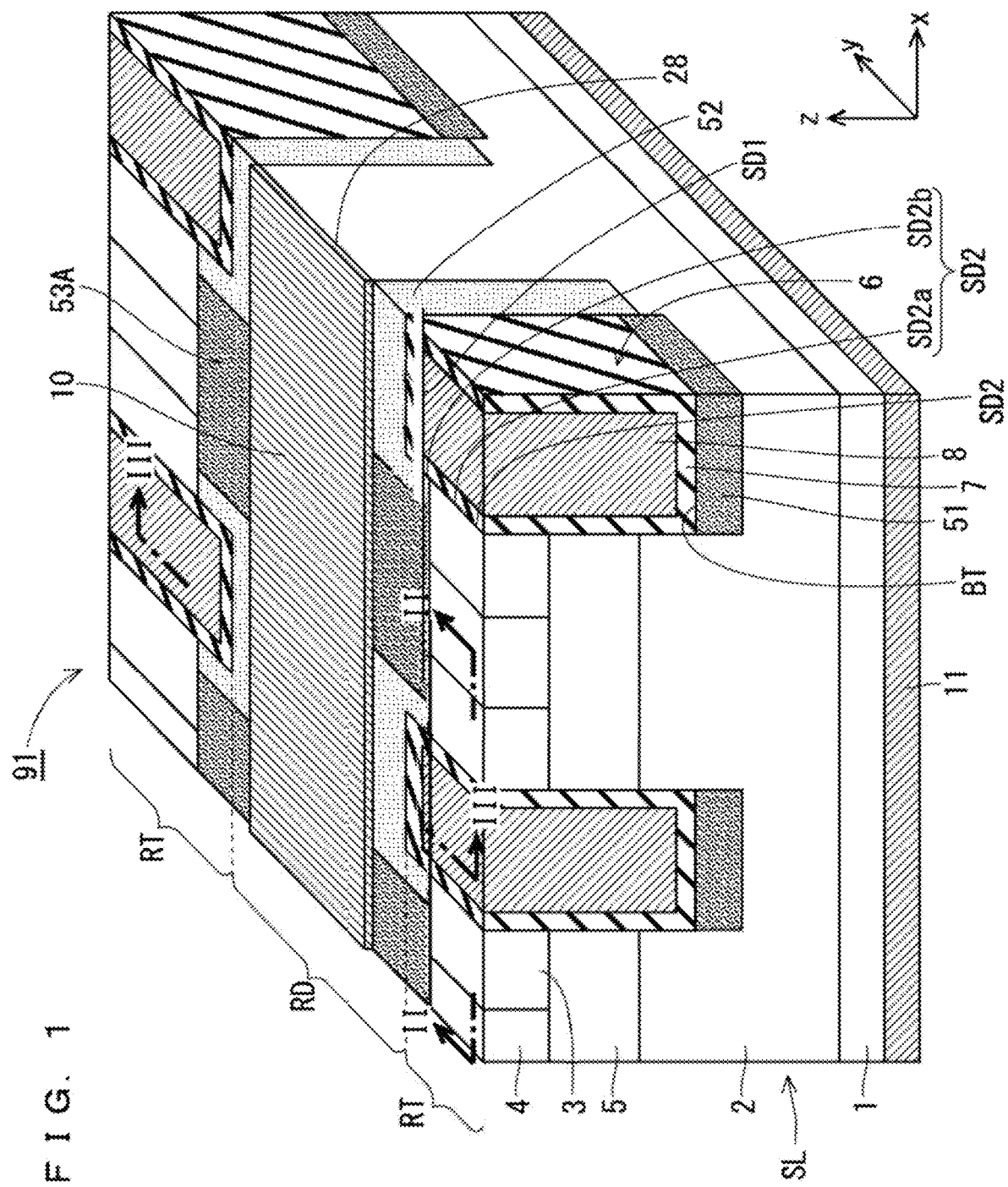
FIG. 1 is a cross-sectional perspective view schematically showing the configuration of a silicon carbide semiconductor device according to a first embodiment of the present invention while omitting the illustration of a part of the configuration.

Embodiments of the present invention will be described below on the basis of the drawings. In the drawings referred to below, corresponding or comparable parts are given the same reference number. Such parts will not be described repeatedly. In some of the drawings, an xyz coordinate system as an orthogonal coordinate system is shown for the convenience of description. In the present description, an "impurity concentration" in each region (or layer) means a maximum of an impurity concentration in this region (or layer).

First Embodiment (Configuration)

Figure 2:
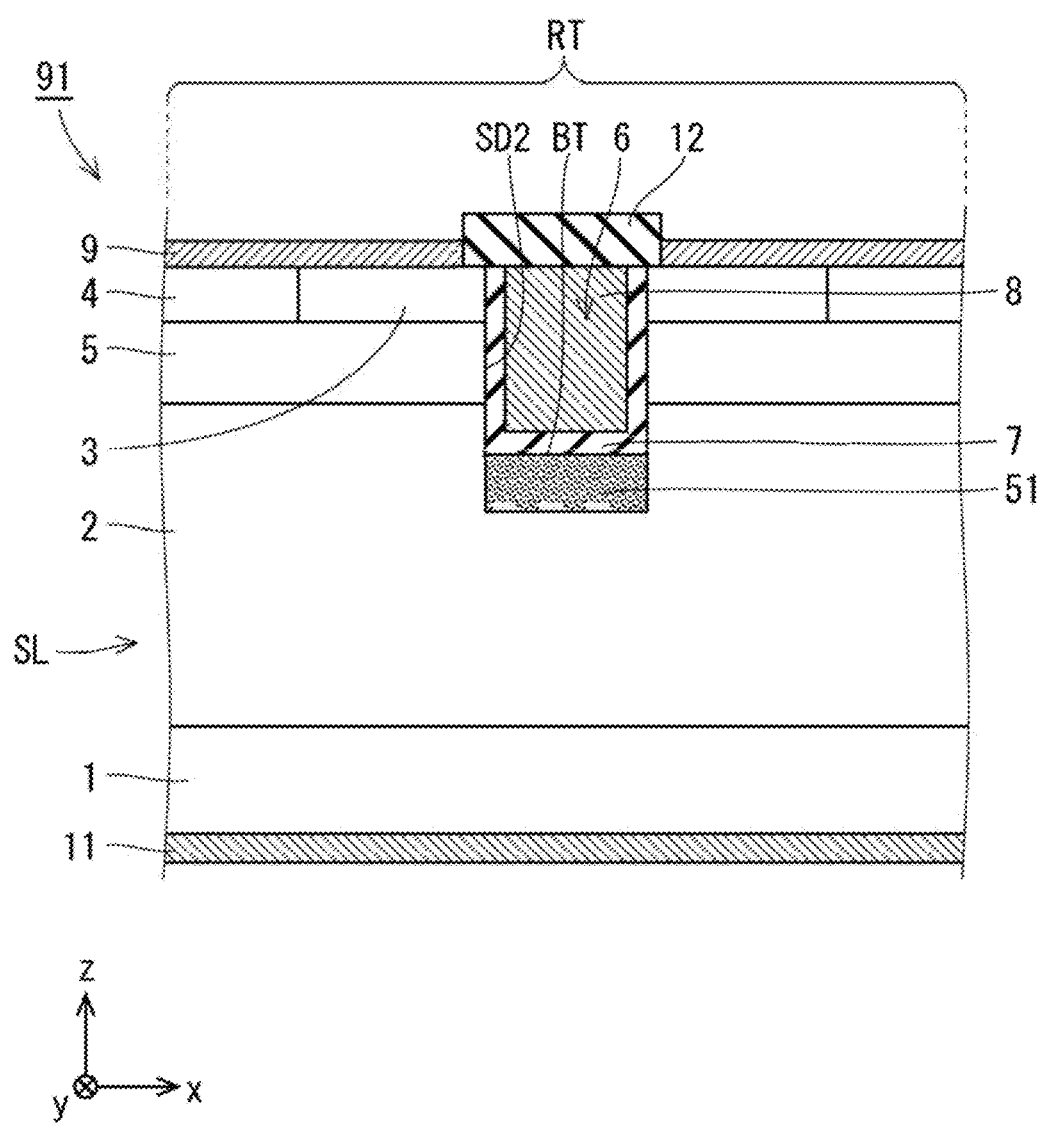
FIG. 2 is a schematic partial cross-sectional view taken along a line II-II in FIG. 1.
Figure 3:
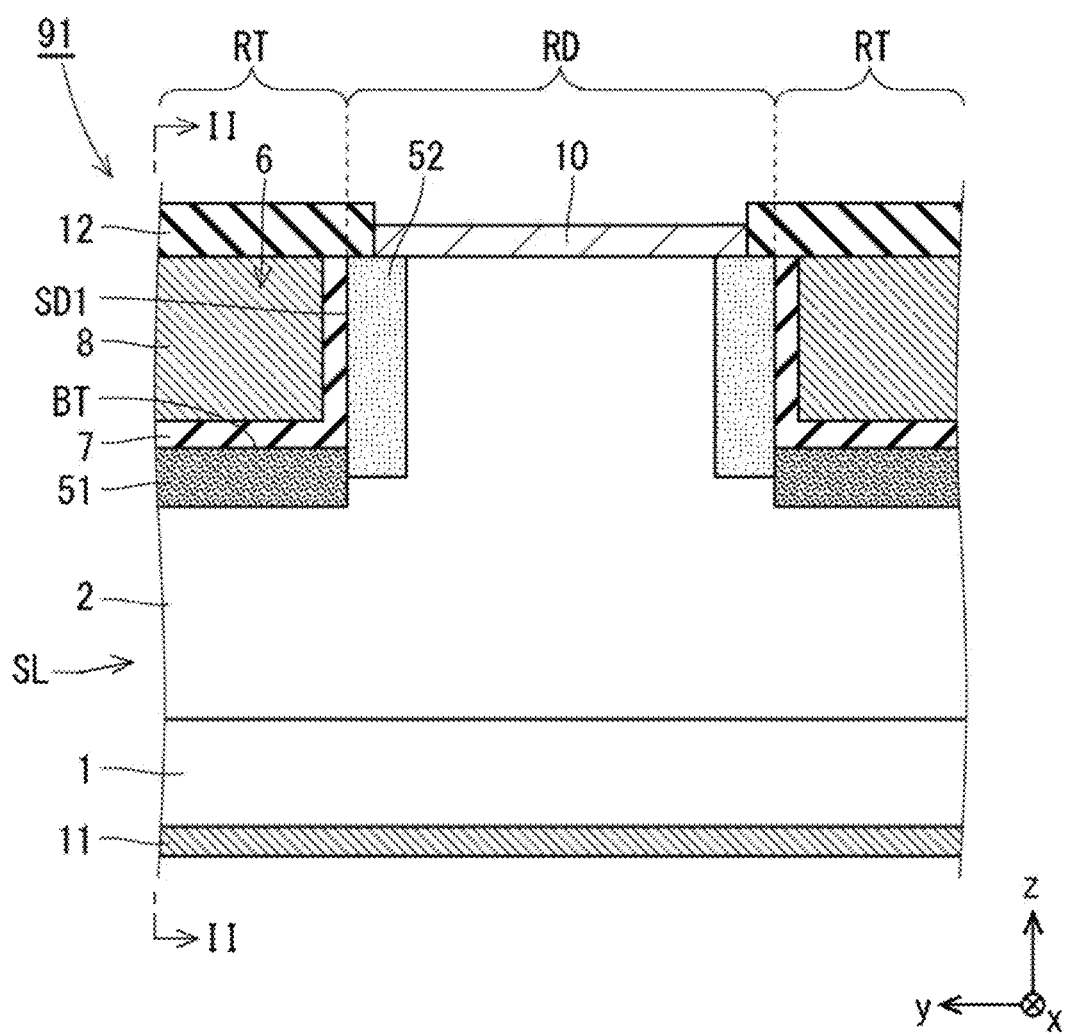
FIG. 3 is a schematic partial cross-sectional view taken along a line in FIG. 1.

FIG. 1 is a cross-sectional perspective view schematically showing the configuration of a silicon carbide semiconductor device according to a first embodiment while omitting the illustration of a part of the configuration. FIG. 2 is a schematic partial cross-sectional view taken along a line II-II in FIG. 1. FIG. 3 is a schematic partial cross-sectional view taken along a line III-III in FIG. 1. A silicon carbide semiconductor device 91 includes a transistor region RT in which a Schottky barrier diode region RD is interposed in a y direction (at least one direction) included in an xy in-plane direction.

The silicon carbide semiconductor device 91 includes a substrate 1, a semiconductor layer SL, a gate electrode 8, a gate insulating film 7, a Schottky electrode 10, a source electrode 9, a drain electrode 11, and an interlayer insulating film 12. The substrate 1 is an SiC substrate having an n-type (first conductivity type). The semiconductor layer SL is provided on the upper surface of the substrate 1. The semiconductor layer SL may be made of SiC in its entirety. The semiconductor layer SL includes a drift layer 2, a body region 5, a source region 3, a body contact region 4, a plurality of trenches 6 (at least one trench), a first protective region 51, a second protective region 52, and a third protective region 53A.

The drift layer 2 extends over the transistor region RT and the Schottky barrier diode region RD and reaches a surface of the semiconductor layer SL in the Schottky barrier diode region RD. The drift layer 2 is made of SiC and has an n-type. The drift layer 2 is lower in n-type impurity concentration (donor concentration) than the substrate 1.

The body region 5 is provided on the drift layer 2 in the transistor region RT and has a p-type (second conductivity type different from the first conductivity type). The source region 3 is provided on the body region 5 and has the n-type. The body contact region 4 is continuous with the body region 5 and reaches the surface of the semiconductor layer SL. The body contact region 4 has the p-type and is set at a lower p-type impurity concentration (acceptor concentration) than the body region 5 for the purpose of reducing a resistance of contact with the source electrode 9.

The trench 6 is formed at the upper surface of the semiconductor layer SL. The trench 6 has a first side surface SD1 and a second side surface SD2. The trench 6 has side surfaces in a pair facing each other. One of these side surfaces is illustrated as the second side surface SD2. One and the other of these side surfaces in a pair are connected through the first side surface SD1. A configuration defined by one of the side surfaces in a pair (second side surface SD2) and a configuration defined by the other side surface may be substantially equal to each other arranged in a substantially symmetric manner.

The first side surface SD1 faces the Schottky barrier diode region RD in the y direction. The second side surface SD2 extends in the y direction in the transistor region RT, and contacts the source region 3, the body region 5, and the drift layer 2. Thus, in the transistor region RT, the trench 6 extends from a surface of the source region 3 and penetrates the body region 5 to reach the drift layer 2. In the transistor region RT, the source region 3, the body region 5 and the drift layer 2, and the gate electrode 8 facing the source region 3, the body region 5 and the drift layer 2 across the gate insulating film 7 form an MOS structure. In a direction in which the trench 6 extends (y direction), the Schottky barrier diode region RD is interposed in the trench 6. In other words, as shown in FIG. 1, the trench 6 is divided in the extending direction (y direction) thereof and the Schottky barrier diode region RD is interposed between the trenches 6 defined by the division. The trenches 6 are aligned in an x direction, thereby forming arrangement of the trenches 6 in stripe shapes. A region other than the Schottky barrier diode region RD and including the trench 6 is the transistor region RT.

The first protective region 51 has the p-type and is higher in p-type impurity concentration than the body region 5. The first protective region 51 is provided under the trench 6. At least a part of the first protective region 51 overlaps the trench 6 in terms of a position in the xy in-plane direction. The first protective region 51 is separated from the substrate 1. The first protective region 51 preferably contacts a bottom BT of the trench 6. The first protective region 51 may project further into the drift layer 2 than the side surface of the trench 6. As a modification, the first protective region 51 be separated from the trench 6. More specifically, the bottom BT of the trench 6 and the first protective region 51 may be separated from each other through the drift layer 2.

The second protective region 52 extends from a side surface of the first protective region 51. In the configuration shown in FIG. 3, the second protective region 52 contacts the side surface of the first protective region 51, preferably, contacts only a part of the side surface of the first protective region 51 to be separated from the bottom of the first protective region 51. The second protective region 52 has an uppermost portion shallower than a lowermost portion of the body region 5 (FIG. 2). In the example illustrated in FIG. 3, the uppermost portion of the second protective region 52 reaches the surface of the semiconductor layer SL. The second protective region 52 has the p-type and is higher in p-type impurity concentration than the body region 5.

The second side surface SD2 of the trench 6 (FIG. 1) includes an end region SD2b continuous with the first side surface SD1 of the trench 6, and a main region SD2a separated from the first side surface SD1 through the end region SD2b. The main region SD2a of the second side surface SD2 has a function as a trench gate of an MOSFET. On the other hand, the end region SD2b of the second side surface SD2 is an end portion of the trench 6 without a function as a trench gate of the MOSFET. Typically, the main region SD2a of the second side surface SD2 extends to a position where the source region 3 extending toward the Schottky barrier diode region RD reaches. The end region SD2b extends between the main region SD2a and the first side surface SD1. The second protective region 52 reaches at least one of the first side surface SD1 and the end region SD2b of the second side surface SD2, in the first embodiment, reaches both of the first side surface SD1 and the end region SD2b.

The third protective region 53A is provided at least partially in the Schottky barrier diode region RD. In the configuration shown in FIG. 1, the third protective region 53A extends over the Schottky barrier diode region RD and the transistor region RT. The third protective region 53A is adjacent to the second protective region 52 in the x direction. The third protective region 53A is interposed at least partially in the second protective region 52 in a direction (in the x direction of FIG. 1) intersecting the trench extending direction (y direction). The third protective region 53A has a lowermost portion at a shallower position than a lowermost portion of the second protective region 52. The third protective region 53A has the p-type and is higher in p-type impurity concentration than the body region 5. The third protective region 53A preferably reaches the surface of the semiconductor layer SL. The third protective region 53A may be omitted and a corresponding region may be a part of the drift layer 2.

The gate electrode 8 is provided in the trench 6. The gate insulating film 7 is formed on the inner surface (a surface defined by the side surface and the bottom) of the trench 6 to separate the semiconductor layer SL and the gate electrode 8 from each other in the trench 6. In other words, the gate electrode 8 is formed in the trench 6 across the gate insulating film 7. A part of the gate insulating film 7 on the second side surface SD2 of the trench 6 partially contacts the drift layer 2. A part of the gate insulating film 7 on the first side surface SD1 of the trench 6 may or may not contact the drift layer 2 partially. As shown in FIG. 2, the gate electrode 8 is covered with the interlayer insulating film 12.

The Schottky electrode 10 contacts the semiconductor layer SL in the Schottky barrier diode region RD to form a Schottky contact. In the first embodiment, the Schottky electrode 10 contacts a surface of the drift layer 2 in the Schottky barrier diode region RD. The first side surface SD1 of the trench 6 has an upper side spaced from and facing the Schottky electrode 10 in the y direction. As shown in FIG. 3, the Schottky electrode 10 may contact the second protective region 52. In this case, electric field at an edge of the Schottky electrode 10 is relaxed. Alternatively, the Schottky electrode 10 may be separated from the second protective region 52. This makes it possible to ensure a wider current path in an SBD.

The source electrode 9 is provided on the semiconductor layer SL and contacts the source region 3 and the body contact region 4. The source electrode 9 is made of metal silicide such as Ni or Ti to form ohmic contact with the source region 3 and the body contact region 4. The drain electrode 11 is provided on the lower surface of the substrate 1. The drain electrode 11 is a metal electrode made of Ni, for example.

Exemplary impurity concentrations will be described next. The drift layer 2 has an n-type impurity concentration from $1.0 \times 10^{14}$ to $1.0 \times 10^{17}$ cm$^{-3}$. This concentration is set on the basis of the breakdown voltage of the silicon carbide semiconductor device 91, etc. The body region 5 has a p-type impurity concentration from $1.0 \times 10^{14}$ to $1.0 \times 10^{18}$ cm$^{-3}$. The source region 3 has an n-type impurity concentration from $1.0 \times 10^{18}$ to $1.0 \times 10^{21}$ cm$^{-3}$. The body contact region 4 has a p-type impurity concentration from $1.0 \times 10^{18}$ to $1.0 \times 10^{21}$ cm$^{-3}$. Each of the first protective region 51 and the second protective region 52 has a p-type impurity concentration from $1.0 \times 10^{14}$ to $1.0 \times 10^{20}$ cm$^{-3}$. Concentration profiles of these impurity concentrations are not required to be uniform.

(Operation)

Next, the operation of the silicon carbide semiconductor device 91 will be descried simply. If a voltage of equal to or greater than a threshold voltage is applied to the gate electrode 8, a region of a reverse conductivity type, namely, an n-type channel is formed in the body region 5 in the transistor region RT to extend along the second side surface SD2 of the trench 6. By doing so, a current path of a singe conductivity type is formed from the source electrode 9 to the drain electrode 11. This forms a state allowing a current to flow between these electrodes, namely, an ON state of the MOSFET. On the other hand, if a voltage of less than the threshold voltage is applied to the gate electrode 8, a channel is not formed in the body region 5. In this case, a current path such as that formed in the ON state is not formed. This forms a state in which substantially no current is allowed to flow between the drain electrode 11 and the source electrode 9, namely, an OFF state of the MOSFET even in the presence of a voltage applied between these electrodes. Controlling a voltage to be applied to the gate electrode 8 allows implementation of the operation of switching between the ON state and the OFF state. In response to the application of a forward voltage to the SBD provided in the Schottky barrier diode region RD in the OFF state, a unipolar current flows between the Schottky electrode 10 and the drain electrode 11.

(Manufacturing Method)

Next, a method of manufacturing the silicon carbide semiconductor device 91 will be described below by referring to FIGS. 4 to 11. FIGS. 4, 6, 8, and 10 are partial cross-sectional views schematically showing first to fourth steps respectively of the method of manufacturing the silicon carbide semiconductor device 91 according to the first embodiment in a viewing field corresponding to the line II-II (FIG. 1), in other words, in the viewing field of FIG. 2. FIGS. 5, 7, 9, and 11 are partial cross-sectional views schematically showing the first to fourth steps respectively of the method of manufacturing the silicon carbide semiconductor device 91 according to the first embodiment in a viewing field corresponding to the line III-III (FIG. 1), in other words, in the viewing field of FIG. 3.

Figure 4:
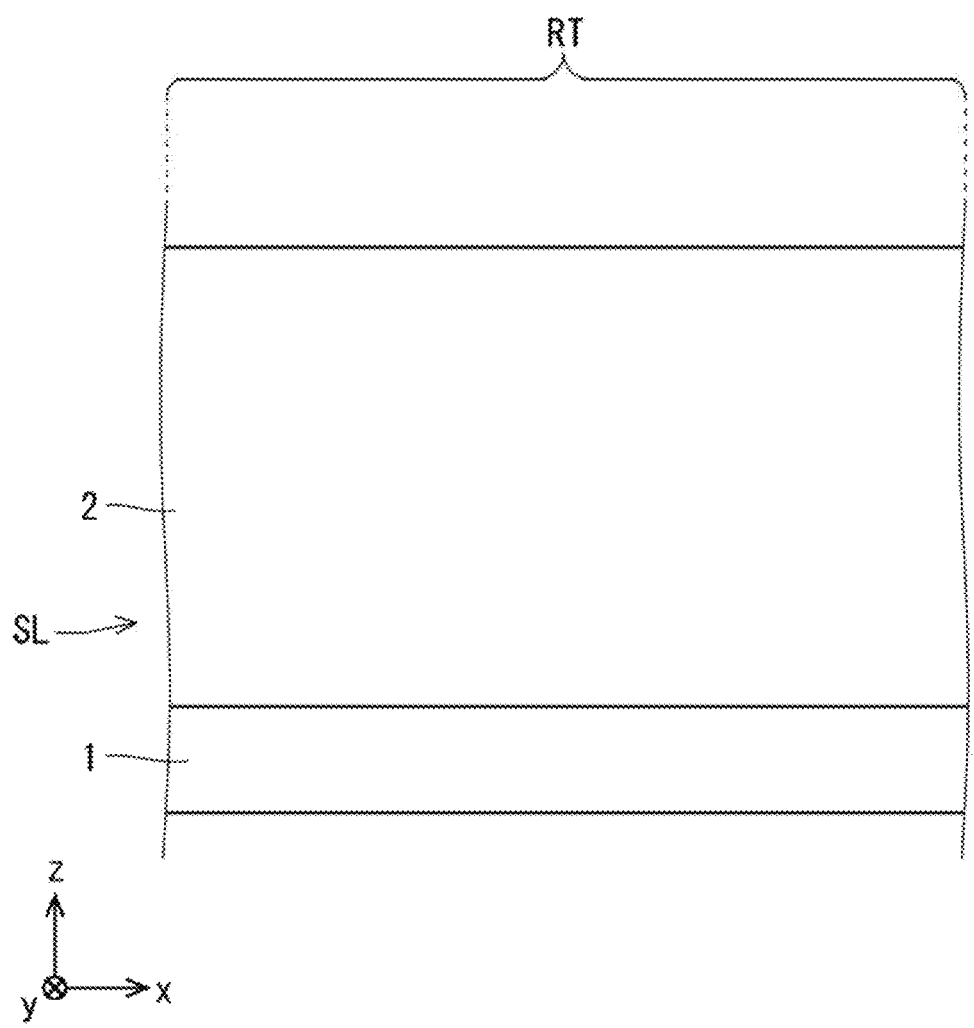
FIG. 4 is a partial cross-sectional view taken along a line IV-IV in FIG. 5 schematically showing a first step of a method of manufacturing the silicon carbide semiconductor device according to the first embodiment of the present invention in a viewing field corresponding to the line II-II (FIG. 1)
Figure 5:
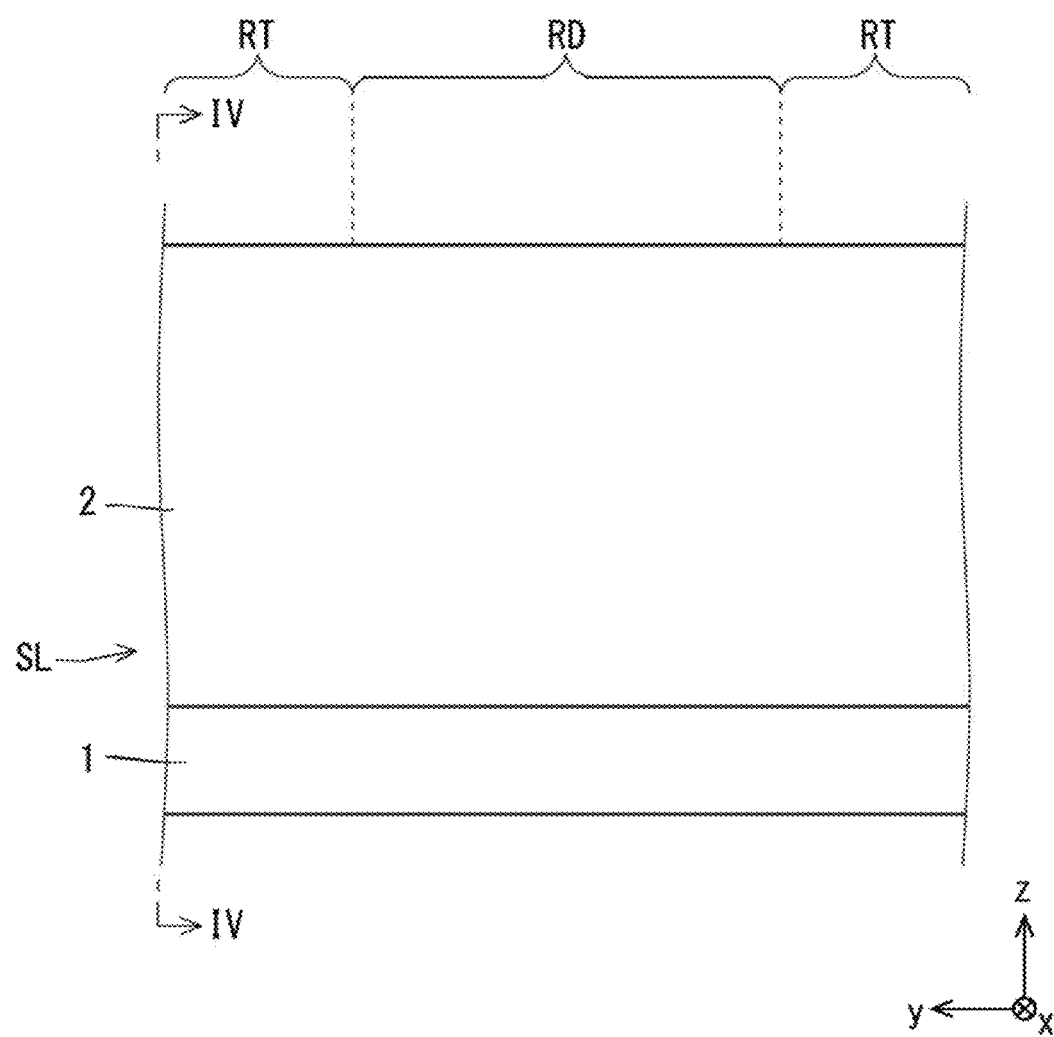
FIG. 5 is a partial cross-sectional view schematically showing the first step of the method of manufacturing the silicon carbide semiconductor device according to the first embodiment of the present invention in a viewing field corresponding to the line III-III (FIG. 1)

Referring to FIGS. 4 and 5, the substrate 1 is prepared on which the n-type drift layer 2 made of SiC is formed as the semiconductor layer SL. In other words, the drift layer 2 extending over the transistor region RT and the Schottky barrier diode region RD is prepared. The drift layer 2 may be formed by epitaxial growth on the substrate 1.

Figure 6:
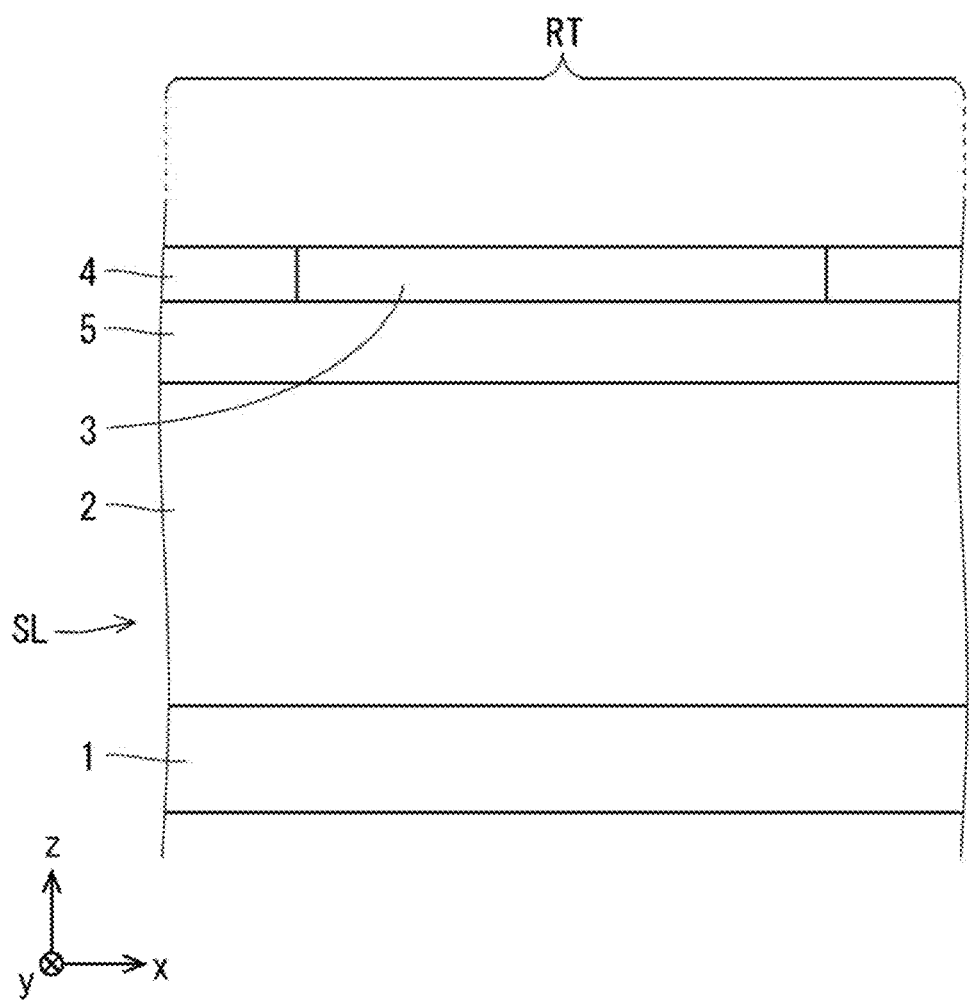
FIG. 6 is a partial cross-sectional view taken along the line IV-IV in FIG. 5 schematically showing a second step of the method of manufacturing the silicon carbide semiconductor device according to the first embodiment of the present invention in a viewing field corresponding to the line II-II (FIG. 1)
Figure 7:
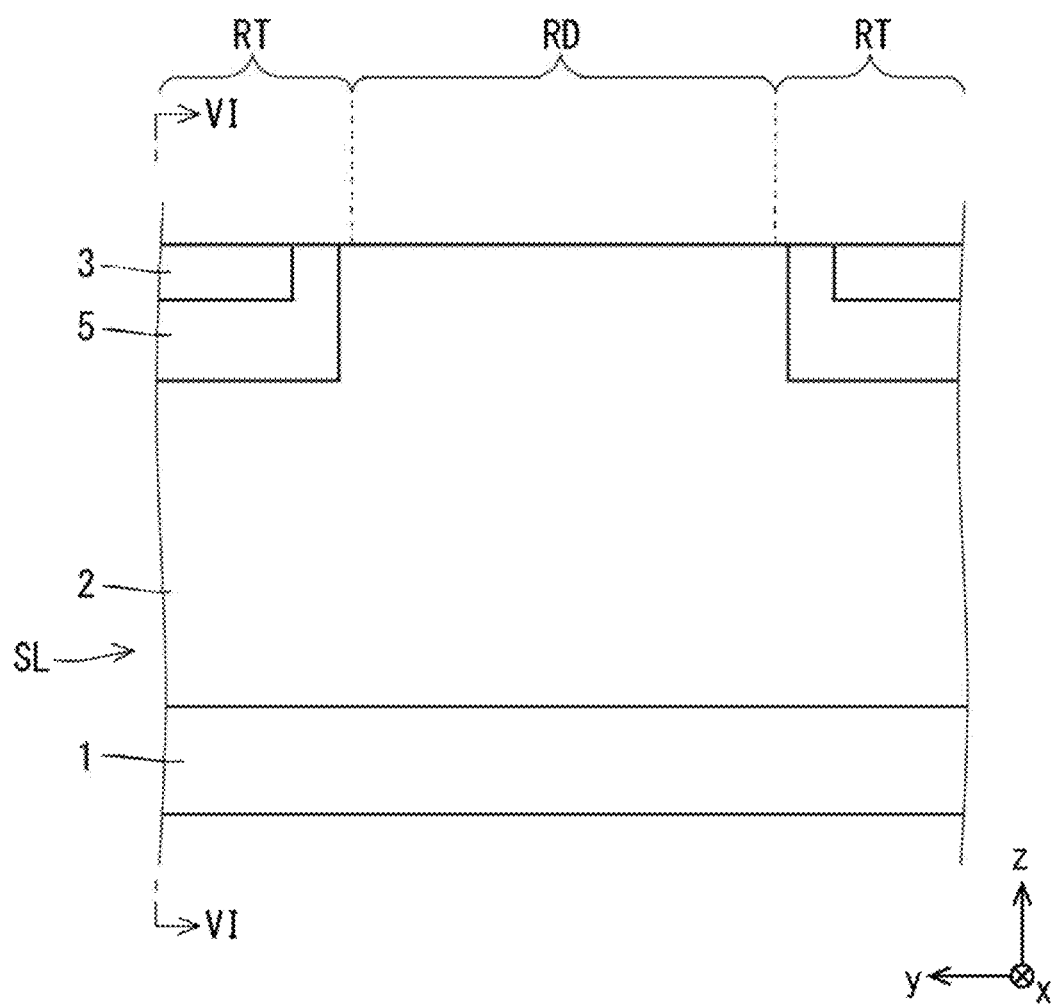
FIG. 7 is a partial cross-sectional view schematically showing the second step of the method of manufacturing the silicon carbide semiconductor device according to the first embodiment of the present invention in a viewing field corresponding to the line III-III (FIG. 1)

Referring to FIGS. 6 and 7, in the transistor region RT, the p-type body region 5 is formed on the n-type drift layer 2.

Further, the p-type body contact region 4 and the n-type source region 3 are formed on the body region 5. These regions may be formed by ion implantation. For the ion implantation for forming the n-type region, donor ions such as N (nitrogen) or P (phosphorus) ions are used. For the ion implantation for forming the p-type region, acceptor ions such as Al (aluminum) or boron (B) ions are used. These regions are formed in any order. All or some of these regions may be formed by epitaxial growth, instead of the ion implantation.

Figure 8:
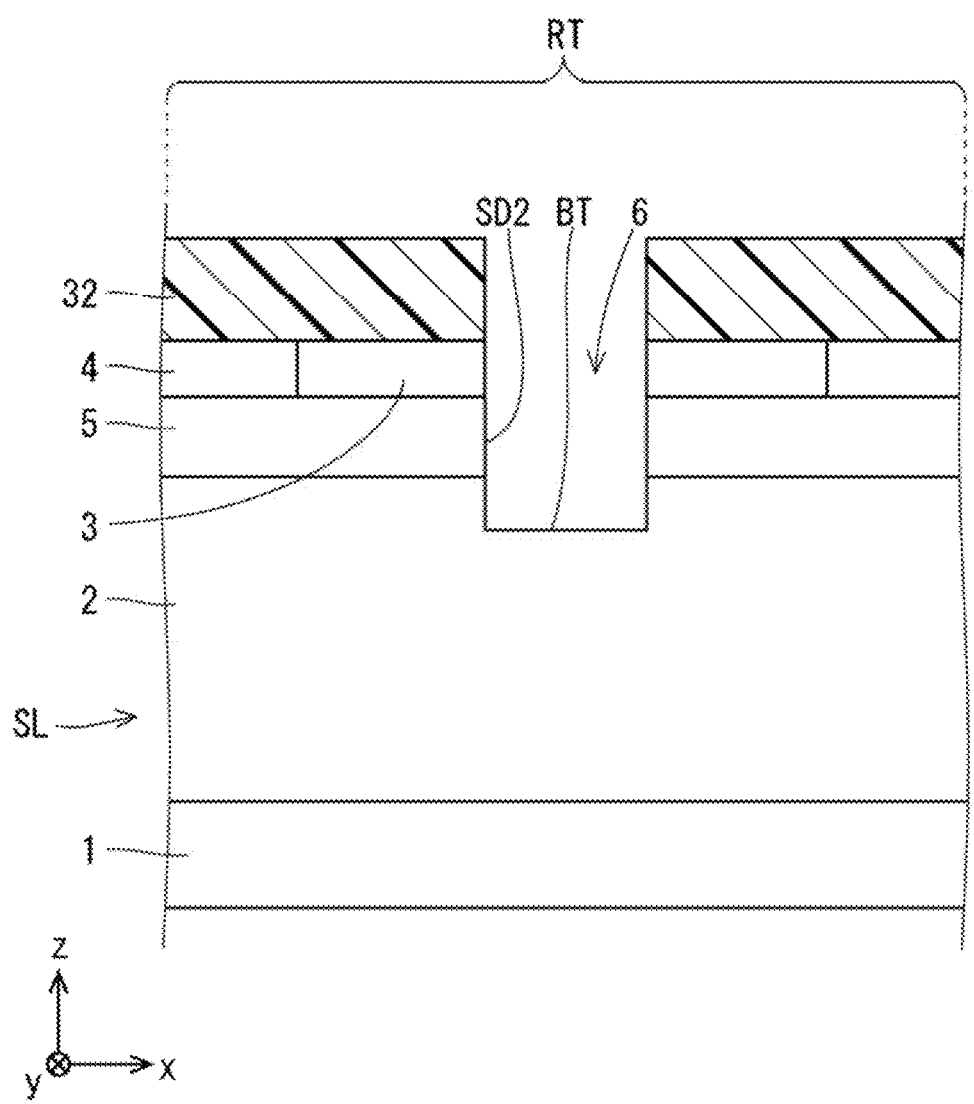
FIG. 8 is a partial cross-sectional view taken along the line IV-IV in FIG. 5 schematically showing a third step of the method of manufacturing the silicon carbide semiconductor device according to the first embodiment of the present invention in a viewing field corresponding to the line II-II (FIG. 1)
Figure 9:
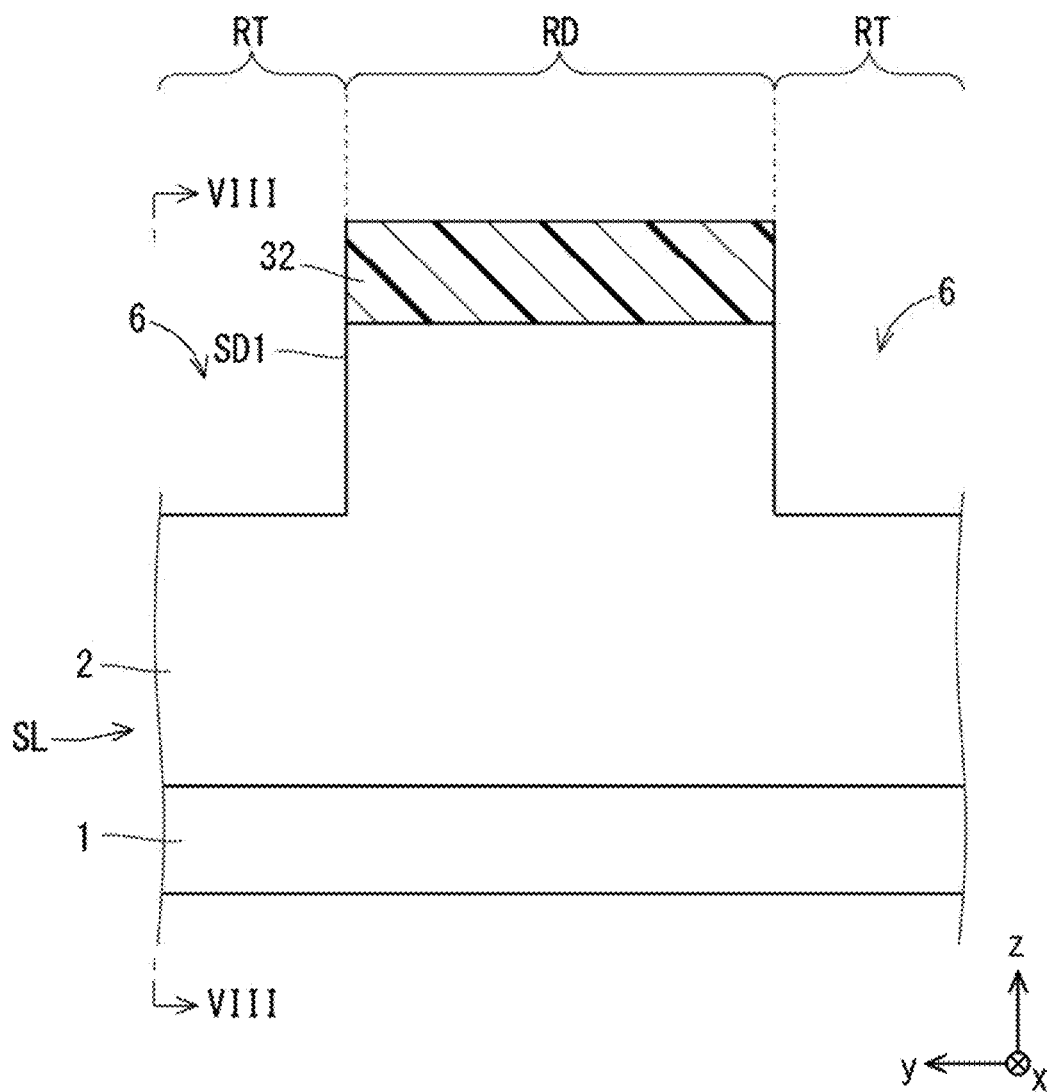
FIG. 9 is a partial cross-sectional view schematically showing the third step of the method of manufacturing the silicon carbide semiconductor device according to the first embodiment of the present invention in a viewing field corresponding to the line III-III (FIG. 1)

Referring to FIGS. 8 and 9, a mask 32 with an opening is formed on the semiconductor layer SL. The trench 6 is formed by reactive ion etching (RIE) using the mask 32. The trench 6 is divided in the extending direction (y direction) thereof to define a region therein as the Schottky barrier diode region RD (FIG. 9).

Figure 10:
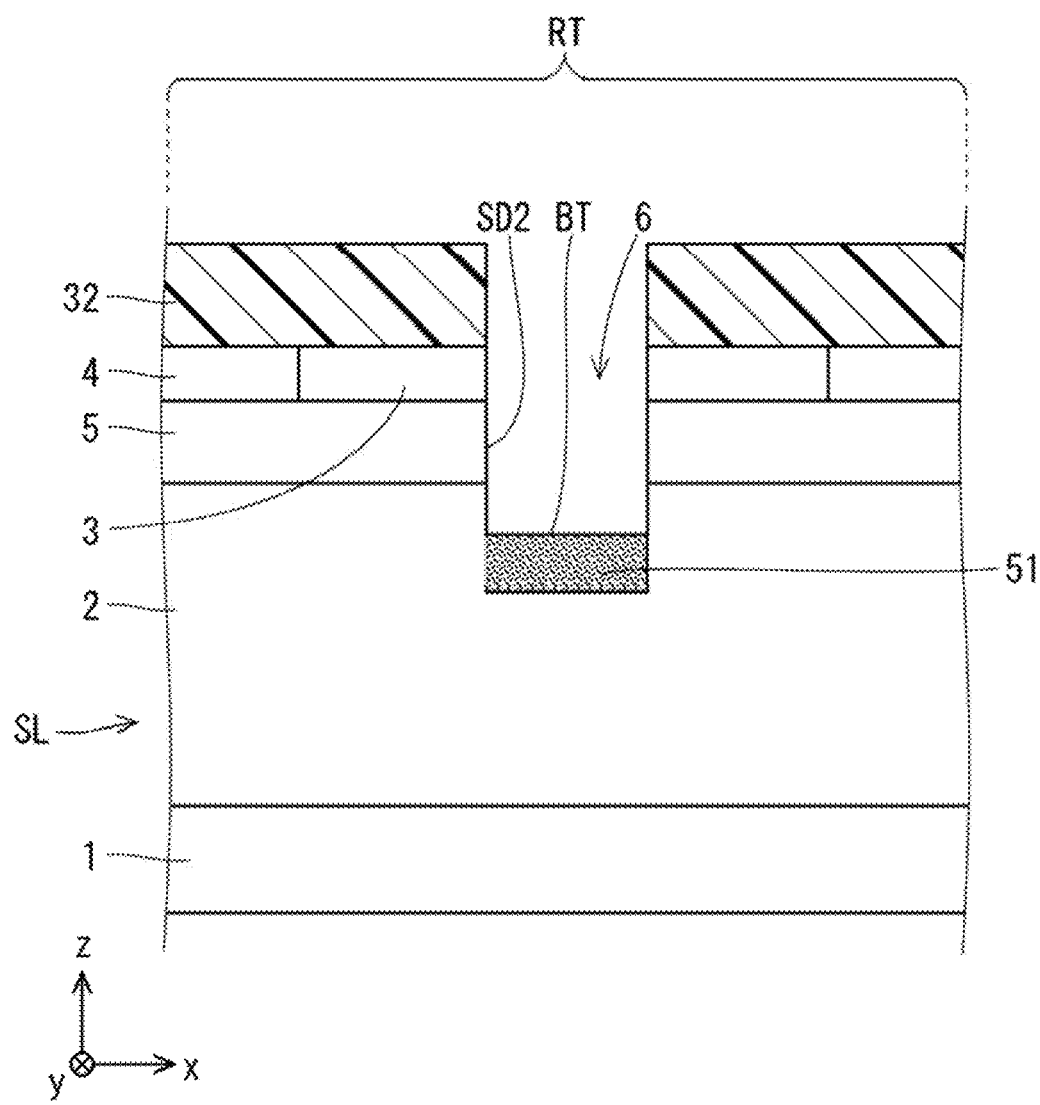
FIG. 10 is a partial cross-sectional view taken along the line IV-IV in FIG. 5 schematically showing a fourth step of the method of manufacturing the silicon carbide semiconductor device according to the first embodiment of the present invention in a viewing field corresponding to the line II-II (FIG. 1)
Figure 11:
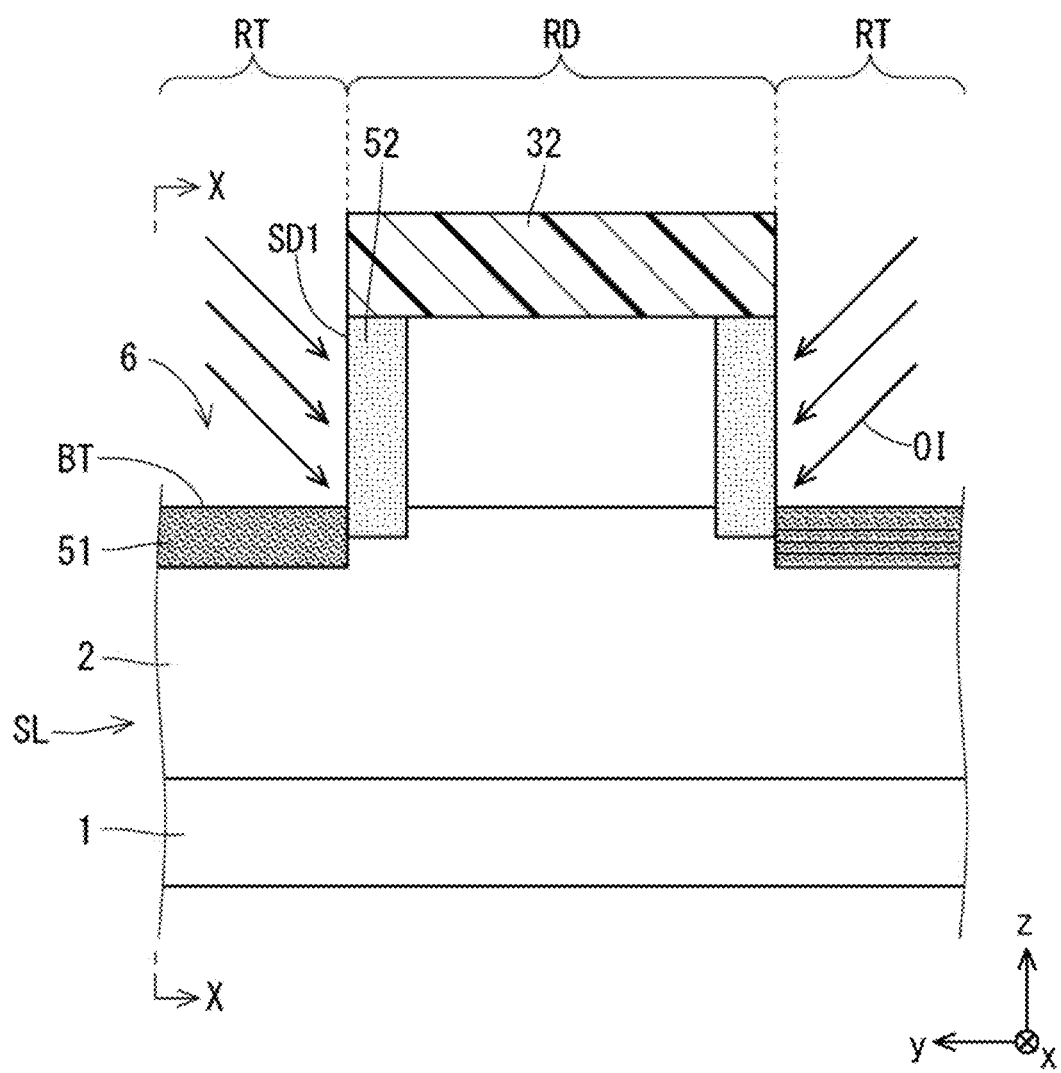
FIG. 11 is a partial cross-sectional view schematically showing the fourth step of the method of manufacturing the silicon carbide semiconductor device according to the first embodiment of the present invention in a viewing field corresponding to the line III-III (FIG. 1)

Referring to FIGS. 10 and 11, p-type ions are implanted into the bottom BT of the trench 6 to form the first protective region 51 under the trench 6. In the example illustrated in the drawings, the first protective region 51 contacts the bottom BT of the trench 6. As a modification, the trench 6 may be formed to a greater depth corresponding to the thickness of the first protective region 51, and then the first protective region 51 may be formed in the trench 6 by epitaxial growth.

The second protective region 52 is formed by ion implantation. At this time, ions are preferably implanted by tilted ion implantation into the first side surface SD1 (see FIG. 11) and the end region SD2b of the second side surface SD2 (see FIG. 1). By the implantation of the tilted ion implantation, the second protective region 52 can be formed simultaneously on the first side surface SD1 and the end region SD2b of the second side surface SD2.

Referring again to FIGS. 2 and 3, the gate insulating film 7 is formed on the bottom BT, on the first side surface SD1, and on the second side surface SD2 of the trench 6. The gate electrode 8 is formed to be buried in the trench 6 across the gate insulating film 7. The interlayer insulating film 12 is formed to cover the gate electrode 8. The Schottky electrode 10 is formed to contact the drift layer 2 in the Schottky barrier diode region RD. The source electrode 9 is formed to contact the surface of the source region 3 and a surface of the body contact region 4. The drain electrode 11 is formed on the back surface of the substrate 1. The silicon carbide semiconductor device 91 can be formed by the steps described above.

FIG. 12 is a partial cross-sectional view schematically showing a step of a modification of the method of manufacturing the silicon carbide semiconductor device 91 according to the first embodiment in a viewing field corresponding to the line III-III (FIG. 1). In the foregoing steps, the first protective region 51 is formed after the formation of the trench 6. Alternatively, the first protective region 51 may be formed before the formation of the trench 6. More specifically, as shown in FIG. 12, the drift layer 2 may be deposited through epitaxial growth of a layer 2a and epitaxial growth of a layer 2b, and the first protective region 51 may be formed by being buried in the drift layer 2 between these deposition steps. A method of forming the first protective region 51 in this case may either be ion implantation or epitaxial growth.

Likewise, the second protective region 52 may be formed before the formation of the trench 6 by implanting ions vertically from the surface of the semiconductor layer SL using an implantation mask with an opening formed in the vicinity of a part to become the first side surface SD1. Then, the trench 6 with the first side surface SD1 covered with the second protective region 52 is formed.

(Simulation of Electric Field Intensity)

Figure 13:
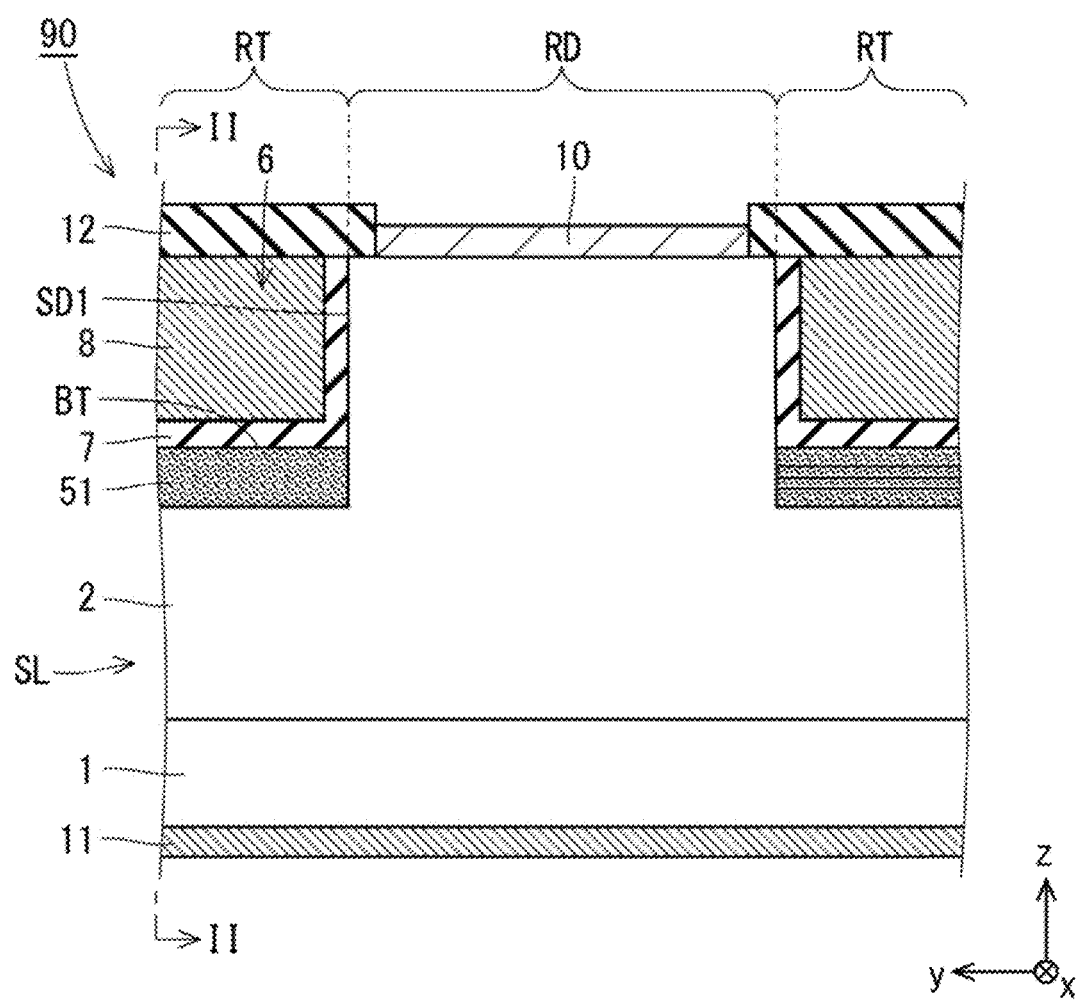
FIG. 13 is a cross-sectional perspective view showing the configuration of a silicon carbide semiconductor device according to a comparative example in a viewing field corresponding to FIG. 3.

FIG. 13 is a cross-sectional perspective view showing the configuration of a silicon carbide semiconductor device 90 according to a comparative example in a viewing field corresponding to FIG. 3. The silicon carbide semiconductor device 90 does not include the second protective region 52 (FIG. 3: first embodiment). This makes the first side surface SD1 of the silicon carbide semiconductor device 90 contact the drift layer 2 in a wide area. Hence, the gate insulating film 7 formed on the first side surface SD1 is exposed in a wide area to the drift layer 2.

Figure 14:
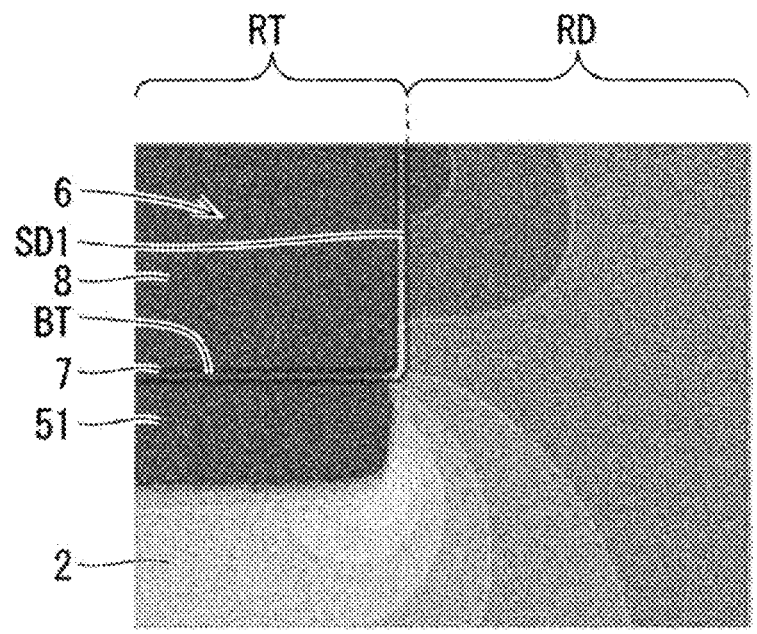
FIG. 14 is a distribution chart showing simulation result about an electric field intensity distribution in an OFF state regarding the silicon carbide semiconductor device according to the comparative example.
Figure 15:
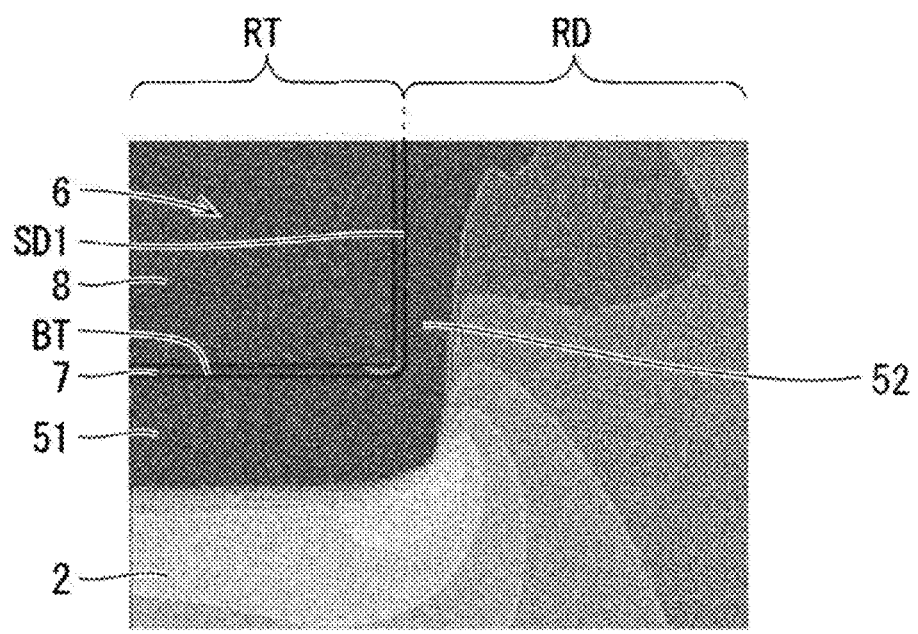
FIG. 15 is a chart showing simulation result about an electric field intensity distribution in an OFF state according to the first embodiment of the present invention.

FIG. 14 is a distribution chart showing simulation result about an electric field intensity distribution in an OFF state regarding the silicon carbide semiconductor device 90 according to the comparative example (FIG. 13). FIG. 15 is a chart showing simulation result about an electric field intensity distribution in an OFF state according to the first embodiment (FIG. 3). In each of these drawings, a brighter region means a region of higher electric field intensity, and a darker region means a region of lower electric field intensity. In each of the drawings, a part of an upper side covered in the Schottky barrier diode region RD corresponds to the left half of a Schottky interface. The transistor region RT shown in each of these drawings include only the first side surface SD1 and its vicinity. Unlike in FIG. 14, the second protective region 52 is provided in FIG. 15. More specifically, as shown in FIG. 3 (first embodiment), the first side surface SD1 of the trench 6 and the drift layer 2 in the Schottky barrier diode region RD are separated from each other through the second protective region 52. For this reason, while the first side surface SD1 contacts the second protective region 52, the first side surface SD1 does not contact the drift layer 2. Except for the presence or absence of the second protective region 52, simulation condition is common between FIGS. 14 and 15.

As understood from the simulation result about the comparative example (FIG. 14), in response to the application of a drain voltage in an OFF state, high electric field is applied to a part of the gate insulating film 7 covering a trench corner (a boundary between the first side surface SD1 and the bottom BT) and to a lower corner (a boundary between the side surface and the bottom) of the first protective region 51. Specifically, electric field concentration is observed at these parts. More specifically, electric field up to 3 MV/cm is applied to the gate insulating film 7. On the other hand, as understood from the simulation result about the first embodiment (FIG. 15), in response to the application of a drain voltage in an OFF state, electric field applied to the gate insulating film 7 is reduced not to exceed 0.5 MV/cm as a maximum while electric field concentration of a certain degree is observed. This result shows that, by the presence of the second protective region 52, the maximum intensity of electric field applied to the gate insulating film 7 is reduced significantly.

The foregoing simulation is conducted with the second protective region 52 extending to the upper surface of the semiconductor layer LS (see FIG. 3). In this regard, electric field concentration at the gate insulating film 7 occurs at the lower end and its vicinity of the first side surface SD1. Thus, the uppermost portion of the second protective region 52 is not always required to extend to the upper surface of the semiconductor layer SL but significant effect relating to electric field relaxation at the gate insulating film 7 is considered to be achieved, as long as the uppermost portion of the second protective region 52 extends to a depth position at least shallower than the lowermost portion of the body region 5 (FIG. 2). If the second protective region 52 extends to the upper surface of the semiconductor layer SL, however, the effect is considered to be achieved more reliably. If the first side surface SD1 and the drift layer 2 are separated from each other through the second protective region 52 (if the first side surface SD1 does not contact the drift layer 2), the effect is considered to be achieved still more reliably.

(Effect)

According to the first embodiment, the second protective region 52 of the semiconductor layer SL (FIG. 3) extends from the side surface of the first protective region 51 to the first side surface SD1 of the trench 6 and has the uppermost portion shallower than the lowermost portion of the body region 5. This forms an electric field relaxation region using the first protective region 51 and the second protective region 52 for protecting the lower end and its vicinity of the second side surface SD2 of the trench 6. This reduces the occurrence of insulation breakdown of the gate insulating film 7 at the lower end and its vicinity of the second side surface SD2 of the trench 6 due to electric field concentration. Thus, the insulation reliability of the gate insulating film 7 can be increased. As a result, it becomes possible to increase the breakdown voltage of the silicon carbide semiconductor device 91.

A sufficiently high Schottky current can be obtained by increasing the width dimension of the Schottky barrier diode region RD (the dimension thereof in the y direction of FIG. 3), where necessary. In this case, the absence of the second protective region 52 (see FIG. 13) would cause a risk of reducing the effect of relaxing electric field at the gate insulating film 7 to be achieved by the first protective region 51; in the first embodiment, by the contribution of the second protective region 52, the gate insulating film 7 is protected sufficiently. In this way, according to the first embodiment, while the sufficient Schottky barrier diode region RD is provided, the insulation reliability of the gate insulating film 7 can be increased.

The Schottky barrier diode region RD and the transistor region RT are adjacent to each other in the y direction, not in the x direction. This allows a plurality of the trenches 6 to be arranged densely in the x direction without interposing the Schottky barrier diode region RD between the trenches 6. This makes it possible to reduce an interval between the trench stripes. In other words, a cell pitch can be reduced. This achieves reduction in maximum electric field to be applied to the gate insulating film 7 even inside the transistor region RT. As a result, the insulation reliability of the gate insulating film 7 can be increased to a greater extent.

The presence of the second protective region 52 allows a certain degree of relaxation of electric field concentration at the lower corner of the first protective region 51 (see FIGS. 14 and 15). This further makes it possible to reduce the occurrence of insulation breakdown of the semiconductor layer SL at the lower corner of the first protective region 51.

The presence of the third protective region 53A allows reduction in electric field intensity at the second protective region 52. This further allows reduction in electric field intensity at a Schottky interface defined by the Schottky electrode 10. As a result, it becomes possible to increase the reliability of the gate insulating film 7 to a greater extent.

(Modification of Configuration)

Figure 16:
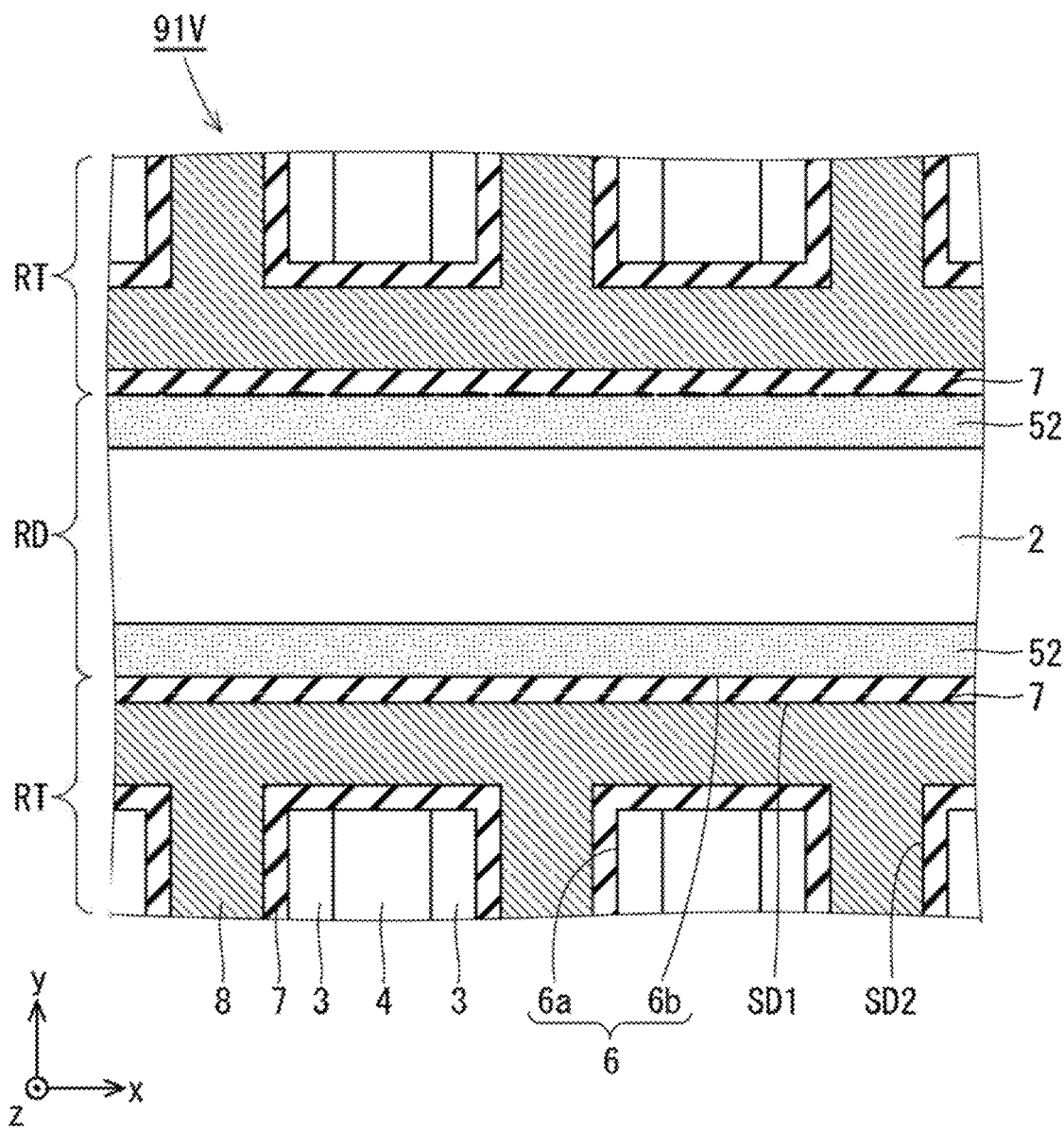
FIG. 16 is a partial top view schematically showing the configuration of a silicon carbide semiconductor device according to a modification of the first embodiment of the present invention while omitting the illustration of a part of the configuration.

FIG. 16 is a partial top view schematically showing the configuration of a silicon carbide semiconductor device 91V according to a modification of the first embodiment. For the convenience of description, the illustrations of the source electrode 9, the interlayer insulating film 12, and the Schottky electrode 10 are omitted. To enhance the viewability of the drawing, hatches are added to the drawing.

According to this modification, the trench 6 includes a plurality of adjacent trenches 6a and a connection trench 6b. Each of the adjacent trenches 6a extends in the y direction. The adjacent trenches 6a are adjacent to each other in the x direction (a direction orthogonal to the y direction). The connection trench 6b extends in the x direction (a direction intersecting the y direction) and connects the adjacent trenches 6a to each other.

In the example illustrated in FIG. 16, the connection trench 6b is arranged at a boundary between the transistor region RT and the Schottky barrier diode region RD. This is not the only arrangement of the connection trench 6b but the connection trench 6b may be separated from the Schottky barrier diode region RD. While one connection trench 6b extending in one direction connects three adjacent trenches 6a in the example illustrated in FIG. 16, a different configuration is applicable. For example, a first connection trench connecting the adjacent trenches 6a at the right side and at the center may be provided, and a second connection trench connecting the adjacent trenches 6a at the center and at the left side may be provided. In this case, the positions of the first and second connection trenches in the y direction may be shifted from each other.

Second Embodiment

Figure 17:
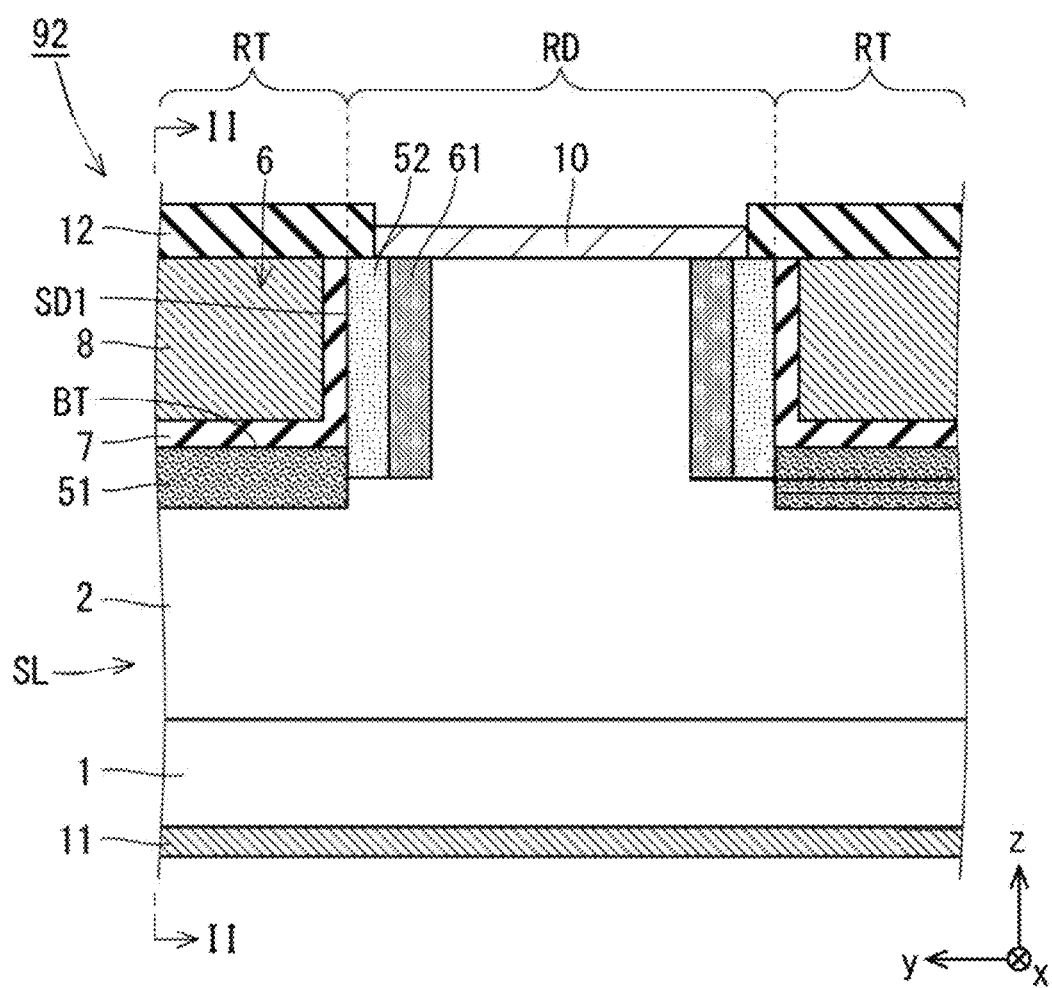
FIG. 17 is a partial cross-sectional view schematically showing the configuration of a silicon carbide semiconductor device according to a second embodiment of the present invention in a viewing field corresponding to the viewing field of FIG. 3.

FIG. 17 is a partial cross-sectional view schematically showing the configuration of a silicon carbide semiconductor device 92 according to a second embodiment in a viewing field corresponding to the viewing field of FIG. 3. In the silicon carbide semiconductor device 92, the semiconductor layer SL includes a first low-resistance region 61. The first low-resistance region 61 has the n-type and is higher in n-type impurity concentration than the drift layer 2. The first low-resistance region 61 is provided over the first side surface SD1 of the trench 6 across the second protective region 52. The first low-resistance region 61 has a lowermost portion that preferably reaches the same depth as at least the lowermost portion of the second protective region 52. More preferably, in the second embodiment, the first low-resistance region 61 has an extending range covering an extending range of the second protective region 52 in a depth direction (longitudinal direction in the drawing). Preferably, the first low-resistance region 61 contacts an entire side surface of the second protective region 52 facing a region under the Schottky electrode 10. This will be described by referring to FIG. 17. Preferably, the first low-resistance region 61 on the left side contacts an entire right side surface of the second protective region 52, and the first low-resistance region 61 on the right side contacts an entire left side surface of the second protective region 52.

Like the formation of the second protective region 52 (FIG. 11), the first low-resistance region 61 may be formed by tilted ion implantation. Here, ions to be implanted are n-type impurity ions. This implantation uses higher energy than that used in the formation of the second protective region 52. During this implantation, the mask 32 may be left or may be removed. As a modification, the second protective region 52 may be formed by forming an implantation mask with a wider opening than the trench 6, and then implanting ions into the surface of the semiconductor layer SL in a vertical direction.

A configuration other than the foregoing configuration is substantially the same as that of the first embodiment described above. Thus, a corresponding or comparable element is given the same sign and will not be described repeatedly.

According to the second embodiment, during the operation of an SBD formed by the Schottky electrode 10, a resistive component in a current path in the SBD is reduced around the second protective region 52 by the presence of the first low-resistance region 61. This makes it possible to obtain a higher Schottky current.

Additionally, the presence of the first low-resistance region 61 further formed in the vicinity of the first protective region 51 achieves suppression of bipolar operation by a parasitic pn diode. This makes it possible to obtain a still higher Schottky current, the reason of which will be described below.

FIG. 18 is a graph showing simulation result about a potential distribution at a pn junction and its vicinity formed by the first protective region 51 according to each of the silicon carbide semiconductor device 91 (FIG. 3: first embodiment) and the silicon carbide semiconductor device 92 (FIG. 17: second embodiment). A potential distribution E1 and a potential distribution E2 in the drawing correspond to the silicon carbide semiconductor device 91 and the silicon carbide semiconductor device 92 respectively. Compared to a potential (potential E1) in the absence of the first low-resistance region 61, in the presence of the first low-resistance region 61 (potential E2), a potential around the pn junction formed by the first protective region 51 is increased. In response to the bandgap of SiC, a pn diode made of SiC is normally turned on at about 3.5 V. If a potential in an n-type region is increased, however, the pn diode is not turned on unless a higher bias is applied. Namely, when a forward bias is applied to the diode, the diode is not turned on until a higher voltage is applied to the pn junction formed by the first protective region 51 near the first low-resistance region 61, thereby suppressing bipolar operation. On the other hand, the SBD can be turned on by the application of a bias corresponding to a Schottky barrier. The SBD can normally be turned on at a voltage from about 1 to 2 V lower than the voltage for the pn diode. During the application of the forward bias, the SBD first causes a Schottky current as a unipolar current to start to flow. In response to the application of a higher bias, the pn diode causes a bipolar current to start to flow. As seen from the foregoing, difficulty in turning on the pn diode means that a unipolar current can be caused to flow preferentially by the SBD until a higher voltage is applied. In this way, operation by the parasitic pn diode (body diode) is suppressed to allow the SBD to operate more preferentially.

Third Embodiment

FIG. 19 is a partial cross-sectional view schematically showing the configuration of a silicon carbide semiconductor device 93 according to a third embodiment in a viewing field corresponding to the viewing field of FIG. 17. In the silicon carbide semiconductor device 93, the semiconductor layer SL includes a second low-resistance region 62. The second low-resistance region 62 has the n-type and is higher in n-type impurity concentration than the drift layer 2. The second low-resistance region 62 contacts the Schottky electrode 10 and the drift layer 2. Preferably, the second low-resistance region 62 separates the Schottky electrode 10 and the drift layer 2 from each other. In other words, the second low-resistance region 62 is preferably formed at an entire interface between the Schottky electrode 10 and the drift layer 2 in the silicon carbide semiconductor device 91 (FIG. 3: first embodiment).

The second low-resistance region 62 may be formed by ion implantation using an implantation mask with an opening formed at least in the Schottky barrier diode region RD. This ion implantation may be vertical ion implantation (ion implantation vertical to the surface of the semiconductor layer SL). Alternatively, the first low-resistance region 61 and the second low-resistance region 62 may be formed simultaneously by tilted ion implantation using an implantation mask with an opening formed in the Schottky barrier diode region RD and the vicinity of the first side surface SD1 in the transistor region RT. Still alternatively, the second low-resistance region 62 may be formed by epitaxial growth on a surface layer part of the drift layer 2.

A configuration other than the foregoing configuration is substantially the same as that of the second embodiment described above. Thus, a corresponding or comparable element is given the same sign and will not be described repeatedly. Here, the first low-resistance region 61 is omissible.

According to the third embodiment, by the presence of the second low-resistance region 62, a carrier concentration under a Schottky interface is increased. This achieves resistance reduction in an SBD. As a result, it becomes possible to obtain a still higher Schottky current.

Fourth Embodiment

Figure 20:
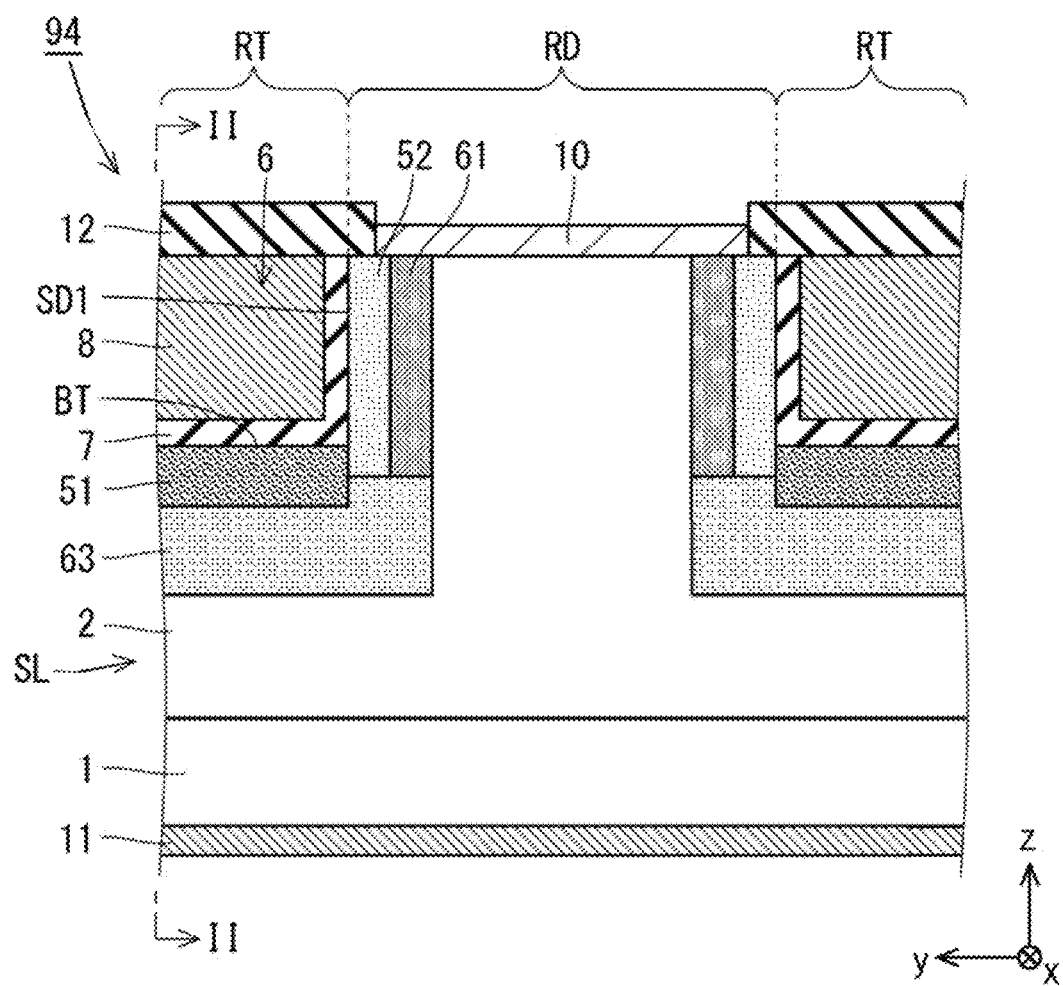
FIG. 20 is a partial cross-sectional view schematically showing the configuration of a silicon carbide semiconductor device according to a fourth embodiment of the present invention in a viewing field corresponding to the viewing field of FIG. 17.

FIG. 20 is a partial cross-sectional view schematically showing the configuration of a silicon carbide semiconductor device 94 according to a fourth embodiment in a viewing field corresponding to the viewing field of FIG. 17. In the silicon carbide semiconductor device 94, the semiconductor layer SL includes a third low-resistance region 63. The third low-resistance region 63 has the n-type and is higher in n-type impurity concentration than the drift layer 2. The third low-resistance region 63 contacts the bottom of the first protective region 51.

The third low-resistance region 63 may be formed by implanting n-type ions into the bottom BT of the trench 6. Implantation energy of this ion implantation is higher than implantation energy of the ion implantation for forming the first protective region 51. Alternatively, the first low-resistance region 61 and the third low-resistance region 63 may be formed simultaneously by tilted ion implantation using an implantation mask with an opening formed in the Schottky barrier diode region RD and the vicinity of the first side surface SD1 in the transistor region RT. Still alternatively, the third low-resistance region 63 may be formed before the formation of the trench 6. More specifically, as shown in FIG. 21, the drift layer 2 may be deposited through epitaxial growth of the layer 2a and epitaxial growth of the layer 2b, and the third low-resistance region 63 may be formed by being buried in the drift layer 2 between these deposition steps. A method of forming the third low-resistance region 63 in this case may either be ion implantation or epitaxial growth.

A configuration other than the foregoing configuration is substantially the same as that of the second embodiment described above. Thus, a corresponding or comparable element is given the same sign and will not be described repeatedly. Here, the first low-resistance region 61 is omissible. The second low-resistance region 62 (FIG. 19: third embodiment) may be added.

According to the fourth embodiment, during the operation of an SBD formed by the Schottky electrode 10, a potential in the n-type region facing the bottom of the first protective region 51 is increased by the presence of the third low-resistance region 63. Thus, for the same reason as that described in the second embodiment, bipolar operation by the parasitic pn diode can be suppressed. As a result, it becomes possible to obtain a still higher Schottky current.

When the MOSFET is in an ON state, a resistance in a lower portion of the first protective region 51 is reduced by the presence of the third low-resistance region 63. By doing so, an MOSFET current is diffused in the lower portion of the first protective region 51. This allows reduction in ON resistance in the MOSFET.

Fifth Embodiment

Figure 22:
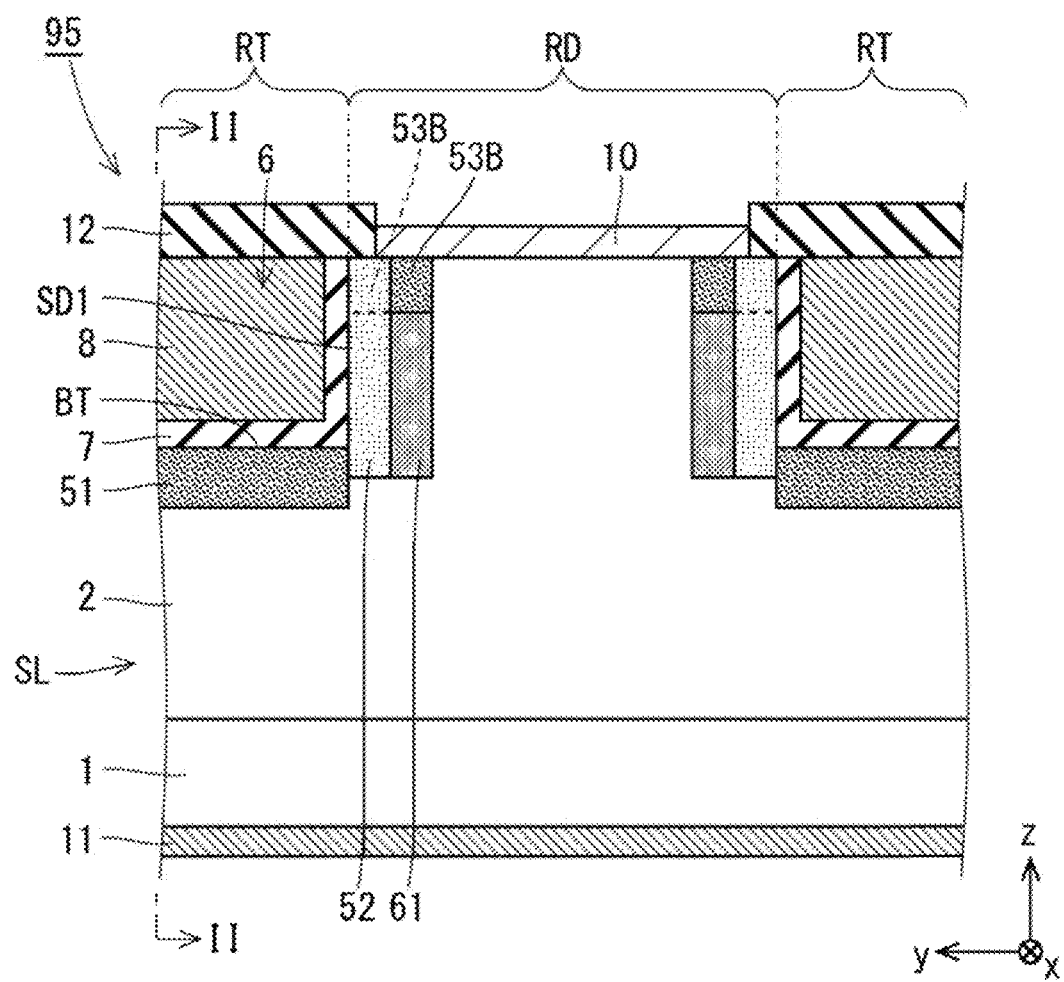
FIG. 22 is a partial cross-sectional view schematically showing the configuration of a silicon carbide semiconductor device according to a fifth embodiment of the present invention in a viewing field corresponding to the viewing field of FIG. 17.

FIG. 22 is a partial cross-sectional view schematically showing the configuration of a silicon carbide semiconductor device 95 according to a fifth embodiment in a viewing field corresponding to the viewing field of FIG. 17. In the silicon carbide semiconductor device 95, the semiconductor layer SL includes the first low-resistance region 61 and a third protective region 53B. Like in the second embodiment (FIG. 17), the lowermost portion of the first low-resistance region 61 preferably reaches the same depth as at least the lowermost portion of the second protective region 52.

The third protective region 53B has the p-type and is higher in p-type impurity concentration than the body region 5. The third protective region 53B has a part arranged between the Schottky electrode 10 and the first low-resistance region 61. The third protective region 53B has a lowermost portion at a shallower position than the lowermost portion of the second protective region 52. The third protective region 53B is partially interposed in the second protective region 52 in the x direction intersecting the trench extending direction (y direction) (see dashed parts in FIG. 22).

For example, the third protective region 53B may be formed simultaneously with the body contact region 4 by the ion implantation step of forming the body contact region 4. This may be achieved by using an implantation mask with an opening formed in a region where the third protective region 53B is to be formed, in addition to a region where the body contact region 4 is to be formed. Alternatively, ion implantation tilted toward the first side surface SD1 of the trench 6 may be performed to form the second protective region 52 and the third protective region 53B simultaneously.

A configuration other than the foregoing configuration is substantially the same as that of the second embodiment described above. Thus, a corresponding or comparable element is given the same sign and will not be described repeatedly. At least one of the second low-resistance region 62 (FIG. 19: third embodiment) and the third low-resistance region 63 (FIG. 20: fourth embodiment) may be added.

According to the fifth embodiment, by the presence of the third protective region 53B between the Schottky electrode 10 and the first low-resistance region 61, electric field concentration at an edge of the Schottky electrode 10 is reduced. This makes it possible to suppress a reverse leakage current in the Schottky electrode 10. In response to application of a high voltage during the OFF state of an MOSFET, a high electric field is generally applied to a Schottky interface at the edge of the Schottky electrode 10. This makes a leakage current from the Schottky interface more prone to increase at the edge of the Schottky electrode 10. This problem becomes more notable, particularly if semiconductor forming the Schottky interface has a higher n-type impurity concentration. In the absence of the third protective region 53B, this problem would become more notable, resulting from the high n-type impurity concentration in the first low-resistance region 61. According to the fifth embodiment, the foregoing problem can be avoided by providing the third protective region 53B between the Schottky electrode 10 and the first low-resistance region 61.

Sixth Embodiment

Figure 23:
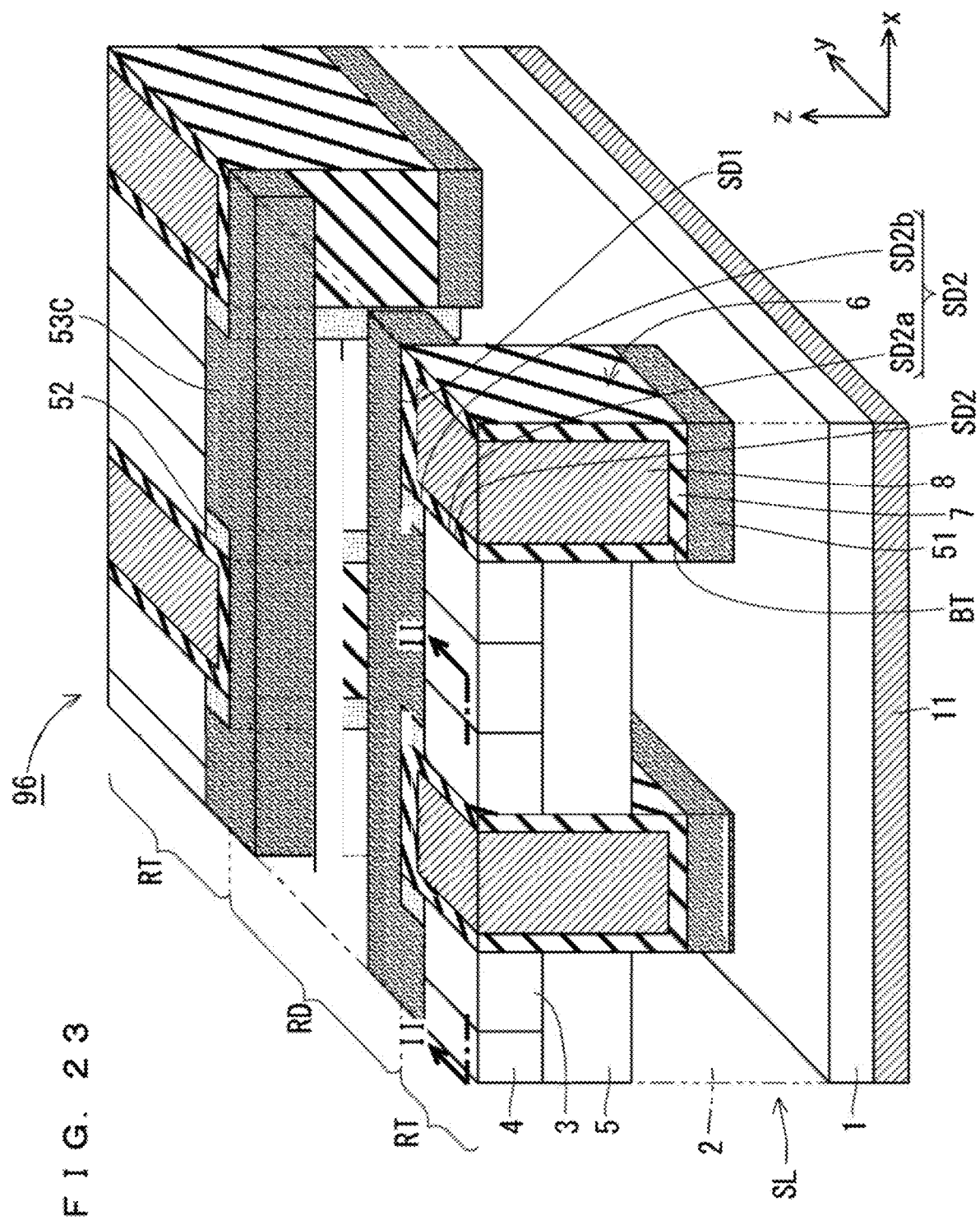
FIG. 23 is a cross-sectional perspective view schematically showing the configuration of a silicon carbide semiconductor device according to a sixth embodiment of the present invention while omitting the illustration of a part of the configuration.

FIG. 23 is a cross-sectional perspective view schematically showing the configuration of a silicon carbide semiconductor device 96 according to a sixth embodiment. For the convenience of description, the illustrations of the source electrode 9, the interlayer insulating film 12, and the Schottky electrode 10 are omitted. The drift layer 2 is shown by drawing only the outer edge thereof using alternate long and two short dashed lines. To enhance the viewability of the drawing, hatches are added to the drawing.

The second protective region 52 extends upward from the side surface of the first protective region 51. In the silicon carbide semiconductor device 96, the second protective region 52 is arranged on the end region SD2b of the second side surface SD2 of the trench 6. Therefore, the second protective region 52 extends from the first protective region 51 to reach the end region SD2b of the second side surface SD2. In the sixth embodiment, the second protective region 52 is preferably not provided on the first side surface SD1. In other words, the second protective region 52 preferably does not have a portion facing the first side surface SD1. In the sixth embodiment, however, the second protective region 52 may be provided only on a part of the first side surface SD1. The second protective region 52 may reach a boundary between the first side surface SD1 and the second side surface SD2 of the trench 6. In this case, the second protective region 52 reaches the first side surface SD1 (more specifically, an edge of the first side surface SD1) of the trench 6. Alternatively, the second protective region 52 may not reach the first side surface SD1. In the sixth embodiment, the drift layer 2 contacts the first side surface SD1 of the trench 6. In other words, at least a part of the first side surface SD1 contacts the drift layer 2.

In the sixth embodiment, the semiconductor layer SL includes a third protective region 53C. The third protective region 53C has the p-type and is higher in p-type impurity concentration than the body region 5. The third protective region 53C contacts the first side surface SD1 of the trench 6 and extends in the x direction intersecting the extending direction (y direction) of the trench 6. The third protective region 53C has a lowermost portion at a shallower position than the lowermost portion of the second protective region 52. The third protective region 53C is interposed partially in the second protective region 52 in the x direction intersecting the trench extending direction (y direction).

The second protective region 52 may be formed by performing tilted ion implantation toward the second side surface SD2 using an implantation mask with an opening of exposing the end region SD2b of the second side surface SD2 of the trench 6, for example. For example, the third protective region 53C may be formed simultaneously with the body contact region 4 by the ion implantation step of forming the body contact region 4. This may be achieved by using an implantation mask with an opening formed in a region where the third protective region 53C is to be formed, in addition to a region where the body contact region 4 is to be formed.

A configuration other than the foregoing configuration is substantially the same as that of the first embodiment described above. Thus, a corresponding or comparable element is given the same sign and will not be described repeatedly. At least one of the second low-resistance region 62 (FIG. 19: third embodiment) and the third low-resistance region 63 (FIG. 20: fourth embodiment) may be applied to the sixth embodiment.

According to the sixth embodiment, the second protective region 52 is absent on at least a part of the first side surface SD1 of the trench 6. This makes it possible to ensure a wide n-type region under the Schottky electrode 10. Additionally, the extension of a depletion layer from the second protective region 52 into the drift layer 2 in the Schottky barrier diode region RD is reduced under bias application. As a result, a degree of narrowing of a Schottky current path caused by the second protective region 52 can be reduced. Thus, it becomes possible to obtain a still higher Schottky current.

Electric field concentration at an edge of the Schottky electrode 10 is suppressed by the presence of the third protective region 53C. This achieves reduction in a reverse leakage current in the Schottky electrode 10.

In each of the embodiments described above in detail, the first conductivity type corresponds to the n-type and the second conductivity type corresponds to the p-type. However, these conductivity types are interchangeable.

The embodiments of the present invention can be combined freely, and each embodiment can be modified or omitted, where appropriate, within a range of the invention. While the invention has been shown and described in detail, the foregoing description is in all aspects illustrative and not to restrict the invention. It is therefore understood that numerous modifications and variations are assumable without departing from the scope of the invention.

EXPLANATION OF REFERENCE SIGNS

RD Schottky barrier diode region
BT Bottom
SD1 First side surface
SD2 Second side surface
SL Semiconductor layer
RT Transistor region
SD2a Main region
SD2b End region
1 Substrate
2 Drift layer
3 Source region
4 Body contact region
5 Body region
6 Trench
6a Adjacent trench
6b Connection trench
7 Gate insulating film
8 Gate electrode
9 Source electrode
10 Schottky electrode
11 Drain electrode
12 Interlayer insulating film
32 Mask
51 First protective region
52 Second protective region
53, 53A to 53C Third protective region
61 First low-resistance region
62 Second low-resistance region
63 Third low-resistance region
91, 91V, 92 to 96 Silicon carbide semiconductor device

The invention claimed is:

1. A silicon carbide semiconductor device with a transistor region in which a Schottky barrier diode region is interposed in at least one direction included in an in-plane direction, the silicon carbide semiconductor device comprising:
   a semiconductor layer extending over the transistor region and the Schottky barrier diode region, the semiconductor layer including,
   a drift layer extending over the transistor region and the Schottky barrier diode region, reaching a surface of the semiconductor layer in the Schottky barrier diode region, being made of silicon carbide, and having a first conductivity type,
   a body region being provided on the drift layer in the transistor region and having a second conductivity type different from the first conductivity type,
   a source region being provided on the body region and having the first conductivity type,
   at least one trench having a first side surface facing the Schottky barrier diode region, and a second side surface extending in the transistor region and contacting the source region, the body region, and the drift layer,
   a first protective region being provided below the at least one trench, having the second conductivity type, and being higher in impurity concentration of the second conductivity type than the body region, and
   a second protective region extending from the first protective region, reaching at least one of the first side surface and an end region of the second side surface, the end region of the second side surface being continuous with the first side surface, the second protective region having an uppermost portion shallower than a lowermost portion of the body region, having the second conductivity type, and being higher in impurity concentration of the second conductivity type than the body region;
   a gate electrode provided in the at least one trench;
   a gate insulating film separating the semiconductor layer and the gate electrode from each other in the at least one trench; and
   a Schottky electrode contacting the semiconductor layer in the Schottky barrier diode region.

2. The silicon carbide semiconductor device according to claim 1, wherein
   the semiconductor layer includes a third protective region, the third protective region being provided at least in the Schottky barrier diode region, being interposed at least partially in the second protective region in a direction intersecting the one direction, having a lowermost portion at a shallower position than a lowermost portion of the second protective region, having the second conductivity type, and being higher in impurity concentration of the second conductivity type than the body region.

3. The silicon carbide semiconductor device according to claim 1, wherein
   the semiconductor layer includes a first low-resistance region, the first low-resistance region being provided over the first side surface of the at least one trench across the second protective region, having the first conductivity type, and being higher in impurity concentration of the first conductivity type than the drift layer.

4. The silicon carbide semiconductor device according to claim 1, wherein
the semiconductor layer includes a second low-resistance region, the second low-resistance region contacting the Schottky electrode and the drift layer, having the first conductivity type, and being higher in impurity concentration of the first conductivity type than the drift layer.

5. The silicon carbide semiconductor device according to claim 1, wherein
the semiconductor layer includes a third low-resistance region, the third low-resistance region contacting the bottom of the first protective region, having the first conductivity type, and being higher in impurity concentration of the first conductivity type than the drift layer.

6. The silicon carbide semiconductor device according to claim 1, wherein
the semiconductor layer includes:
a first low-resistance region being provided over the first side surface of the at least one trench across the second protective region, having the first conductivity type, and being higher in impurity concentration of the first conductivity type than the drift layer; and
a third protective region being provided between the Schottky electrode and the first low-resistance region, having the second conductivity type, and being higher in impurity concentration of the second conductivity type than the body region.

7. The silicon carbide semiconductor device according to claim 1, wherein
the second side surface of the at least one trench has the end region continuous with the first side surface of the at least one trench, the second protective region being arranged on the end region of the second side surface of the at least one trench, and
the drift layer contacts the first side surface of the at least one trench.

8. The silicon carbide semiconductor device according to claim 7, wherein
the semiconductor layer includes a third protective region, the third protective region contacting the first side surface of the at least one trench, extending in a direction intersecting the one direction, having the second conductivity type, and being higher in impurity concentration of the second conductivity type than the body region.

9. The silicon carbide semiconductor device according to claim 1, wherein
the at least one trench includes a plurality of adjacent trenches adjacent to each other in a direction orthogonal to the one direction, and a connection trench extending in a direction intersecting the one direction and connecting the adjacent trenches to each other.

10. The silicon carbide semiconductor device according to claim 1, wherein the at least one trench has a third side surface facing the second side surface, and the second side surface and the third side surface are connected by the first side surface.

11. The silicon carbide semiconductor device according to claim 1, wherein the first side surface faces the Schottky barrier diode region in one direction, and the second side surface extends in the transistor region in the one direction.

12. A method of manufacturing a silicon carbide semiconductor device with a transistor region in which a Schottky barrier diode region is interposed in at least one direction included in an in-plane direction, the method comprising:
preparing a drift layer, the drift layer extending over the transistor region and the Schottky barrier diode region, being, made of silicon carbide, and having a first conductivity type;
forming a body region having a second conductivity type different from the first conductivity type on the drift layer in the transistor region;
forming a source region having the first conductivity type on the body region;
forming at least one trench, the at least one trench having a first side surface facing the Schottky barrier diode region, and having a second side surface extending in the transistor region and contacting the source region, the body region, and the drift layer;
forming a first protective region below the at least one trench, the first protective region having the second conductivity type and being higher in impurity concentration of the second conductivity type than the body region;
forming a Schottky electrode contacting the drift layer in the Schottky barrier diode region; and
forming a second protective region by ion implantation, the second protective region extending from the first protective region, and reaching at least one of the first side surface and an end region of the second side surface, the end region of the second side surface being continuous with the first side surface, the second protective region having an uppermost portion shallower than a lowermost portion of the body region, having the second conductivity type, and being higher in impurity concentration of the second conductivity type than the body region.

13. The method of manufacturing the silicon carbide semiconductor device according to claim 10, wherein
the second side surface of the at least one trench has the end region continuous with the first side surface of the at least one trench, and
the forming of the second protective region includes performing tilted ion implantation into the first side surface and the end region of the second side surface.

* * * * *